US011955159B2

(12) United States Patent
Cho et al.

(10) Patent No.: US 11,955,159 B2
(45) Date of Patent: Apr. 9, 2024

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Sungyong Cho, Anyang-si (KR); Kiheung Kim, Suwon-si (KR); Hyeran Kim, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/703,049

(22) Filed: Mar. 24, 2022

(65) Prior Publication Data

US 2023/0021622 A1 Jan. 26, 2023

(30) Foreign Application Priority Data

Jul. 20, 2021 (KR) .................. 10-2021-0094658
Sep. 16, 2021 (KR) .................. 10-2021-0123649

(51) Int. Cl.
*G11C 11/406* (2006.01)
*G11C 11/408* (2006.01)
(Continued)

(52) U.S. Cl.
CPC .... *G11C 11/40615* (2013.01); *G11C 11/4085* (2013.01); *H03M 13/1105* (2013.01);
(Continued)

(58) Field of Classification Search
CPC .......... G11C 11/40615; G11C 11/4085; G11C 11/4078; G11C 7/24; G11C 7/02;
(Continued)

(56) References Cited

U.S. PATENT DOCUMENTS 8,745,288 B2   6/2014   Na et al.
8,938,573 B2   1/2015   Greenfield et al.
(Continued)

OTHER PUBLICATIONS

Extended European Search Report dated Jan. 2, 2023 issued by the European Patent Office for corresponding European Patent Application No. 22164984.1.

*Primary Examiner* — Thien Nguyen
(74) *Attorney, Agent, or Firm* — Muir Patent Law, PLLC

(57) ABSTRACT

A semiconductor memory device includes a memory cell array including a plurality of memory cell rows, a row hammer management circuit and a refresh control circuit. The row hammer management circuit counts the number of times of access associated with each of the plurality of memory cell rows in response to an active command from an external memory controller to store the counted values in each of the plurality of memory cell rows as count data, determines a hammer address associated with at least one of the plurality of memory cell rows, which is intensively accessed more than a predetermined reference number of times, based on the counted values, and performs an internal read-update-write operation. The refresh control circuit receives the hammer address and to perform a hammer refresh operation on victim memory cell rows which are physically adjacent to a memory cell row corresponding to the hammer address.

17 Claims, 32 Drawing Sheets

(51) Int. Cl.
*H01L 25/065* (2023.01)
*H03M 13/00* (2006.01)
*H03M 13/11* (2006.01)

(52) U.S. Cl.
CPC ....... *H03M 13/611* (2013.01); *H01L 25/0657* (2013.01); *H01L 2225/06541* (2013.01)

(58) Field of Classification Search
CPC .............. G11C 11/40603; G11C 8/08; H03M 13/1105; H03M 13/611; H01L 25/0657; H01L 2225/06541
See application file for complete search history.

(56) References Cited

U.S. PATENT DOCUMENTS

| | | |
|---|---|---|
| 9,299,400 B2 | 3/2016 | Bains et al. |
| 9,384,821 B2 | 7/2016 | Bains et al. |
| 10,770,127 B2 | 9/2020 | Shore et al. |
| 10,818,337 B2 | 10/2020 | Kuramori et al. |
| 2014/0085995 A1 | 3/2014 | Greenfield et al. |
| 2014/0146624 A1 | 5/2014 | Son et al. |
| 2017/0139641 A1* | 5/2017 | Cha ........................ G06F 11/106 |
| 2017/0271026 A1 | 9/2017 | Park |
| 2019/0066808 A1 | 2/2019 | Nale |
| 2019/0228813 A1* | 7/2019 | Nale ................. G11C 11/40611 |
| 2022/0068348 A1* | 3/2022 | Bennett ............... G11C 11/4093 |

\* cited by examiner

FIG. 14

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | L | H | H | H | BL | BA0 | BA1 | BG0 | BG1 | BG2 | CID0 | CID1 | CID2 |
|  | H | H | C3 | C4 | C5 | C6 | C7 | C8 | C9 | C10 | V | H | V | V | CID3 |

FIG. 15

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| WRA | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | AP | L | V | CID3 |
| RDA | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | AP | V | V | CID3 |

FIG. 16

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | h | CID3 | BA0 | BA1 | BG0 | BG1 | BG2 | CID0 | CID1 | CID2 |

SEMICONDUCTOR MEMORY DEVICE AND MEMORY SYSTEM INCLUDING THE SAME

CROSS-REFERENCE TO RELATED APPLICATIONS

This application claims the benefit of priority under 35 USC § 119 to Korean Patent Application No. 10-2021-0094658, filed on Jul. 20, 2021 and to Korean Patent Application No. 10-2021-0123649, filed on Sep. 16, 2021, in the Korean Intellectual Property Office, the disclosure of each of which is incorporated by reference in its entirety herein.

BACKGROUND

The present disclosure relates to memories, and more particularly to semiconductor memory devices to perform a hammer refresh operation and memory systems including the same.

Semiconductor memory devices may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharge state (i.e., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

Example embodiments may provide a semiconductor memory device capable of managing row hammer of all of a plurality of memory cell rows.

Example embodiments may provide a memory system including a semiconductor memory device capable of managing row hammer of all of a plurality of memory cell rows.

According to example embodiments, a semiconductor memory device includes a memory cell array, a row hammer management circuit and a refresh control circuit. The memory cell array includes a plurality of memory cell rows, and each of the plurality of memory cell rows includes a plurality of memory cells. The row hammer management circuit counts the number of times of access associated with each of the plurality of memory cell rows in response to an active command from an external memory controller to store the counted values in each of the plurality of memory cell rows as count data, determines a hammer address associated with at least one of the plurality of memory cell rows, which is intensively accessed more than a predetermined reference number of times, based on the counted values, and in response to a first command applied after the active command, performs an internal read-update-write operation to read the count data from a target memory cell row from among the plurality of memory cell rows, to update the read count data, and to write the updated count data in the target memory cell row. The refresh control circuit receives the hammer address and to perform a hammer refresh operation on one or more victim memory cell rows which are physically adjacent to a memory cell row corresponding to the hammer address.

According to example embodiments, a memory system includes a semiconductor memory device and a memory controller to control the semiconductor memory device. The semiconductor memory device includes a memory cell array, a row hammer management circuit and a refresh control circuit. The memory cell array includes a plurality of memory cell rows, and each of the plurality of memory cell rows includes a plurality of memory cells. The row hammer management circuit counts the number of times of access associated with each of the plurality of memory cell rows in response to an active command from the memory controller to store the counted values in each of the plurality of memory cell rows as count data, determines a hammer address associated with at least one of the plurality of memory cell rows, which is intensively accessed more than a predetermined reference number of times, based on the counted values, and in response to a first command applied after the active command, performs an internal read-update-write operation to read the count data from a target memory cell row from among the plurality of memory cell rows, to update the read count data, and to write the updated count data in the target memory cell row. The refresh control circuit receives the hammer address and to perform a hammer refresh operation on one or more victim memory cell rows which are physically adjacent to a memory cell row corresponding to the hammer address.

According to example embodiments, a memory system includes a semiconductor memory device and a memory controller to control the semiconductor memory device. The semiconductor memory device includes a memory cell array that includes a plurality of memory cell rows, each including a plurality of memory cells. The memory controller applies an active command and a subsequent command to the semiconductor memory device such that the semiconductor memory device counts the number of times of access associated with each of the plurality of memory cell rows in response to the active command to store the counted values in each of the plurality of memory cell rows, manages a row hammer event of each of the plurality of memory cell rows based on the counted values and updates the counted values of each of the plurality of memory cell rows in response to the subsequent command.

Accordingly, the semiconductor memory device and the memory system according to example embodiments, may store the number of times of access of each of a plurality of memory cell rows in each of the plurality of memory cell rows as the count data, and may update the count data based on a subsequent command which is applied after the active command. Therefore, the semiconductor memory device and the memory system may manage row hammer of all of the memory cell rows. In addition, because the user data and the count data are input/output through the same global input/output lines based on time multiplexing, and the ECC engine performs ECC encoding operation and ECC decoding operation on the user data and the count data based on time multiplexing, overhead may be reduced.

BRIEF DESCRIPTION OF THE DRAWINGS

Example embodiments will be described below in more detail with reference to the accompanying drawings.

FIGS. 14 through 16 illustrate example commands which may be used in the memory system of FIG. 1.

DETAILED DESCRIPTION

Various example embodiments will be described more fully hereinafter with reference to the accompanying drawings, in which example embodiments are shown.

Figure 1:
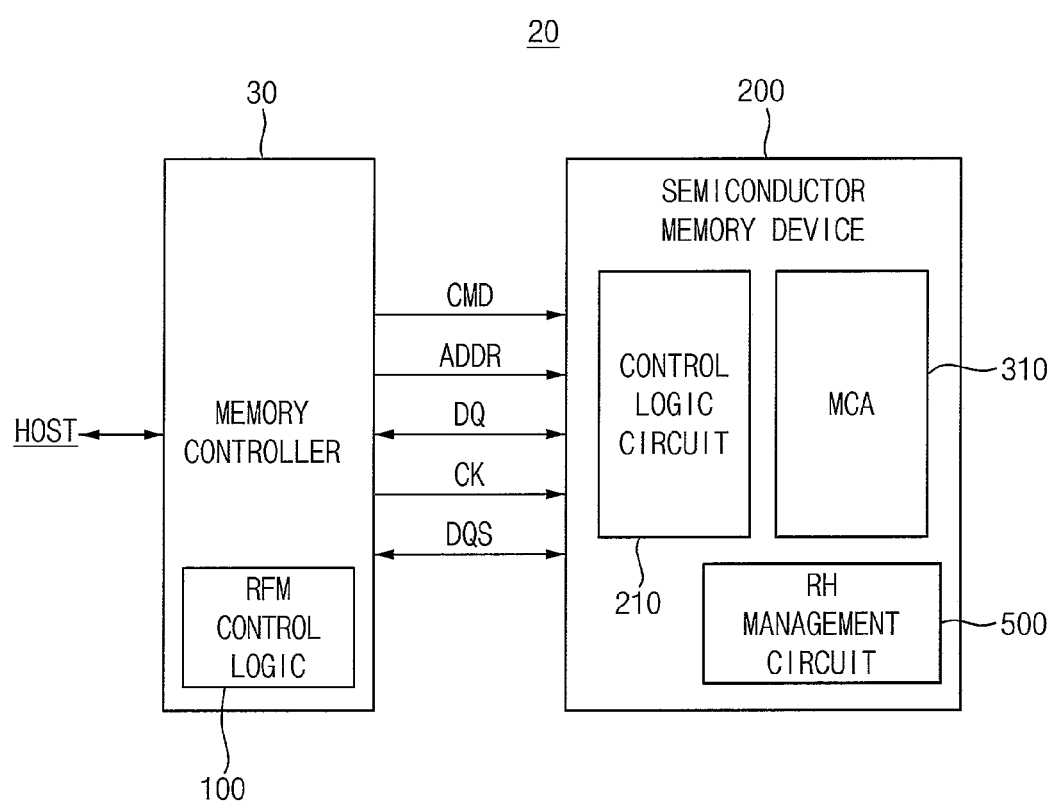
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), a DDR6 SDRAM, or the like.

The memory controller 30 transmits a clock signal CK (the clock signal CK may be referred to a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR may be used interchangeably. The memory controller 30 may transmit a data strobe signal DQS to the semiconductor memory device 200 when the memory controller 30 writes data signal DQ in the semiconductor memory device 200. The semiconductor memory device 200 may transmit a data strobe signal DQS to the memory controller 30 when the memory controller 30 reads data signal DQ from the semiconductor memory device 200. The address ADDR may be accompanied by the command CMD and the address ADDR may be referred to as an access address.

The memory controller 30 may include a refresh management (RFM) control logic 100 that generates a RFM command associated with a row hammer of the plurality of memory cell rows.

The semiconductor memory device 200 includes a memory cell array 310 that stores the data signal DQ, a control logic circuit 210 and a row hammer (RH) management circuit 500.

The control logic circuit 210 may control operations of the semiconductor memory device 200.

The memory cell array 310 may include a plurality of memory cell rows and each of the memory cell rows may include a plurality of volatile memory cells.

The row hammer management circuit 500 may count the number of times of access associated with each of the plurality of memory cell rows in response to an active command from the memory controller 30 to store the counted values in each of the plurality of memory cell rows as count data, and may determine a hammer address associated with at least one of the plurality of memory cell rows, which is intensively accessed, based on the counted values. Herein, the terms "intensively accessed" may mean that a particular memory cell row is accessed equal to or more than a reference number of times (e.g., NTH shown in FIG. 5A).

In response to a subsequent command such as an active count update command or a precharge command applied after the active command, the row hammer management circuit 500 may perform an internal read-update-write operation, to read the count data from a target memory cell row from among the plurality of memory cell rows, to update the read count data, and to write the updated count data in the target memory cell row. The row hammer management circuit 500 may update the counting values stored in the target memory cell row in response to the subsequent command. The active count update command may be a dedicated command for designating the internal read-update-write operation, which is applied to the semiconductor memory device 200 after a read command or a write command on the target memory cell row and before precharging the target memory cell row.

In example embodiments, the hammer management circuit 500 may perform the internal read-update-write operation before precharging the target memory cell row in response to either a read command including an auto precharge or a write command including an auto precharge which is selectively applied after the active command is applied.

The semiconductor memory device 200 performs a refresh operation periodically due to charge leakage of memory cells storing data. Due to scale down of the manufacturing process of the semiconductor memory device 200, the storage capacitance of the memory cell is decreased and the refresh period is shortened. The refresh period is further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme is developed to reduce the burden of the memory controller. The memory controller is totally responsible for the hammer refresh operation in the TRR scheme and the semiconductor memory device is totally responsible for the hammer refresh operation in the in-memory refresh scheme.

The chip size overhead for the in-memory refresh may be serious as the memory capacity is increased and demands on low power consumption of the semiconductor memory device is increased. In addition, the power consumption may be increased because the semiconductor memory device has to care the hammer refresh operation even though there is no intensive access. In addition, a row hammer of some of memory cell row selected from the plurality of the memory cell rows is managed.

In the memory system 20 according to example embodiments, the row hammer management circuit 500 counts the number of times of access associated with each of the plurality of memory cell rows to store the counted values in each of the plurality of memory cell rows as count data and may manage the row hammer of all of the memory cell rows based on the counted values.

Figure 2:
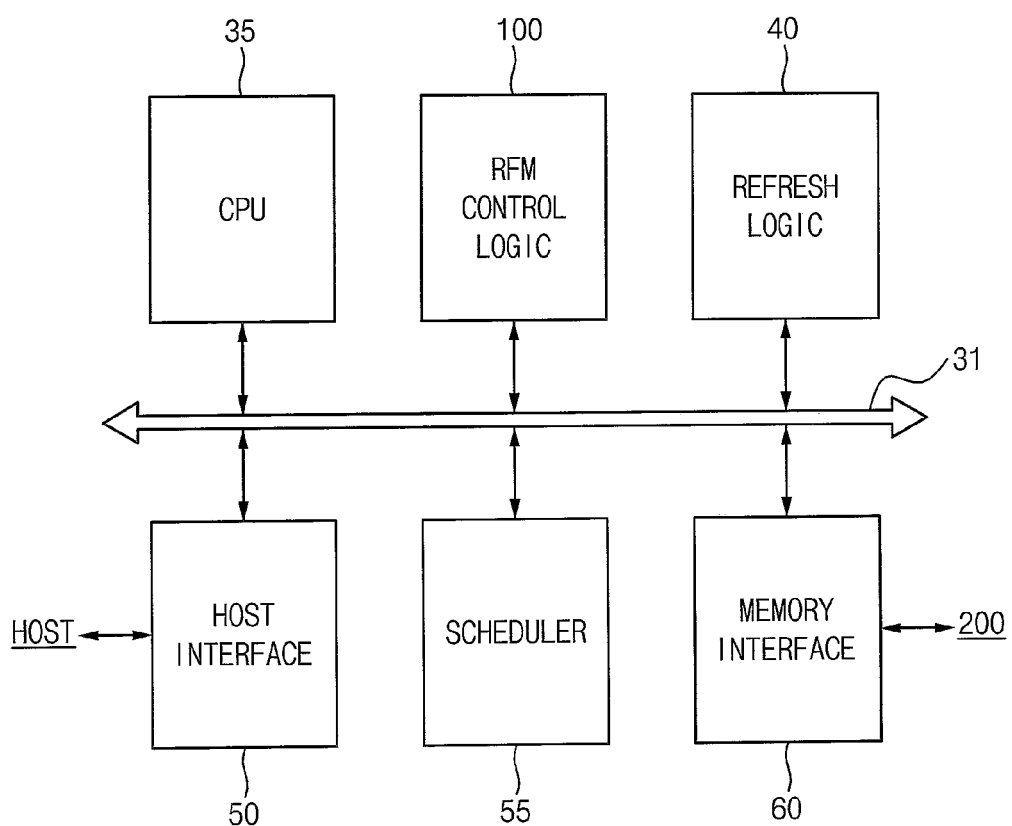
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include a central processing unit (CPU) 35, the RFM control logic 100, a refresh logic 40, a host interface 50, a scheduler 55 and a memory interface 60 which are connected to each other through a bus 31.

The CPU 35 may control overall operation of the memory controller 30. The CPU 35 may control the RFM control logic 100, the refresh logic 40, the host interface 50, the scheduler 55 and the memory interface 60 through the bus 31.

The refresh logic 40 may generate auto refresh command for refreshing memory cells of the plurality of memory cell rows based on a refresh interval of the semiconductor memory device 200.

The host interface 50 may perform interfacing with a host. The memory interface 60 may perform interfacing with the semiconductor memory device 200.

The scheduler 55 may manage scheduling and transmission of sequences of commands generated in the memory controller 30. The scheduler 55 may transmit the active command and subsequent commands to the semiconductor memory device 200 via the memory interface 60 and the semiconductor memory device 200 may update active count of each of the memory cell rows to may manage the row hammer of all of the memory cell rows.

The memory interface 60 may perform interfacing with the semiconductor memory device 200.

Figure 3:
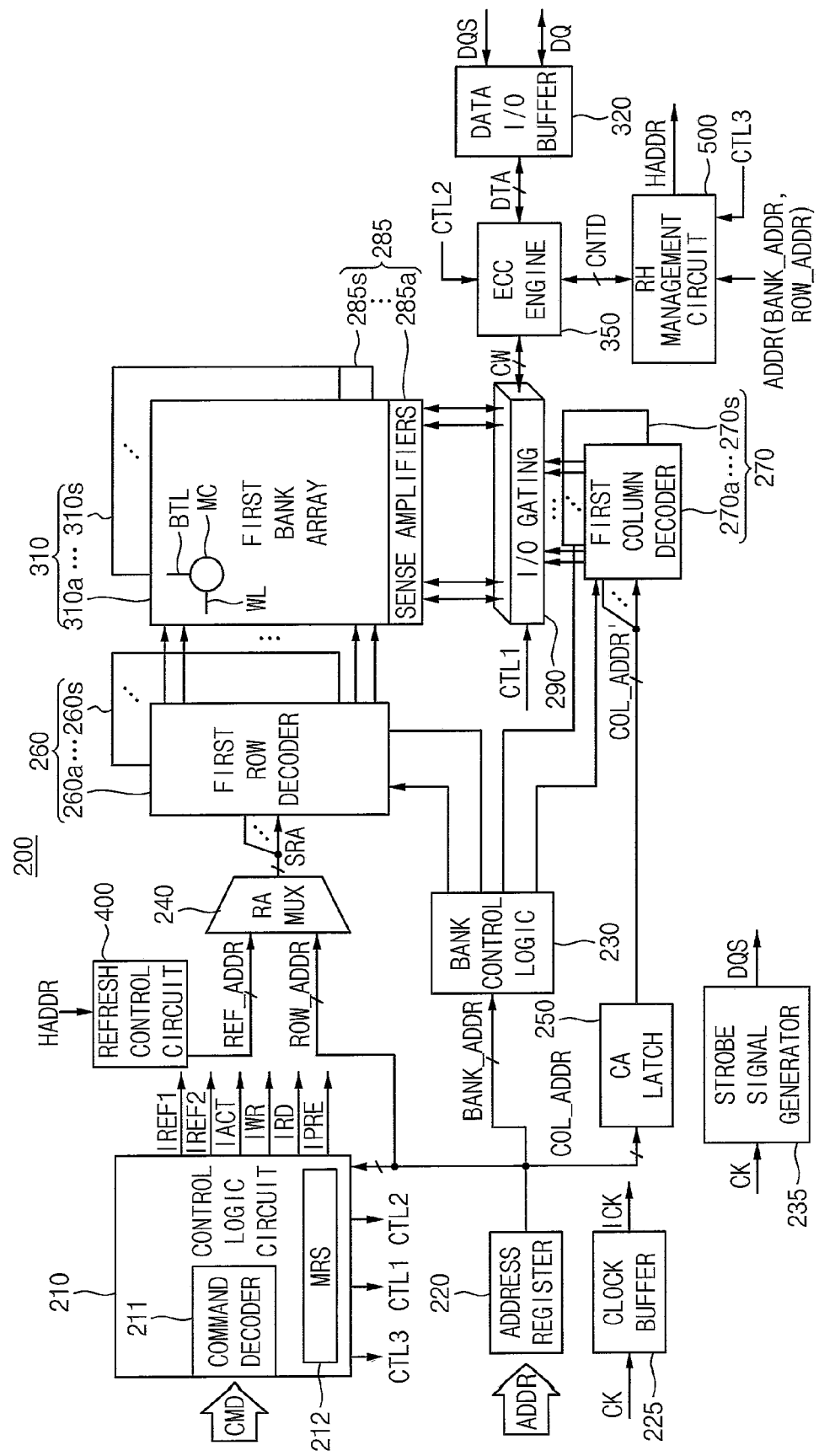
FIG. 3 is a block diagram illustrating an example of the semiconductor memory device in FIG. 1 according to example embodiments.

FIG. 3 is a block diagram illustrating an example of the semiconductor memory device in FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an I/O gating circuit 290, an error correction code (ECC) engine 350, a clock buffer 225, a strobe signal generator 235, the row hammer management circuit 500 and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s and first through sixteenth sense amplifiers 285a~285s may form first through sixteenth banks. Each of the first through sixteenth bank arrays 310a~310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s.

The refresh control circuit 400 may sequentially increase or decrease the refresh row address REF_ADDR in a normal refresh mode in response to first and second refresh control signals IREF1 and IREF2 from the control logic circuit 210. The refresh control circuit 400 may receive a hammer address HADDR in a hammer refresh mode, and may output one or more hammer refresh row addresses designating one or more victim memory cell rows physically adjacent to a memory cell row corresponding to the hammer address as the refresh row address REF_ADDR.

The activated one of the first through sixteenth row decoders 260a~260s, by the bank control logic 230, may decode the row address SRA that is output from the row address multiplexer 240, and may activate a word-line corresponding to the row address SRA. For example, the activated bank row decoder applies a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

Codeword CW (e.g., read codeword RCW in FIG. 12) read from a selected one bank array of the first through sixteenth bank arrays 310a~310s is sensed by a sense amplifier coupled to the selected one bank array from which the data is to be read, and is stored in the read data latches. The codeword CW stored in the read data latches may be provided to the data I/O buffer 320 as data DTA (e.g., corrected data C_DTA in FIG. 12) after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected one bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform an ECC encoding on the data DTA and may perform an ECC decoding on the codeword CW based on a second control signal CTL2 from the control logic circuit 210. The ECC engine 350 may perform an ECC encoding and an ECC decoding on count data CNTD provided from the row hammer management circuit 500 based on the second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the memory controller 30.

The control logic circuit 210 may control operations of the semiconductor memory device 200. For example, the control logic circuit 210 may generate control signals for the semiconductor memory device 200 in order to perform a write operation, a read operation, a normal refresh operation and a hammer refresh operation. The control logic circuit 210 includes a command decoder 211 that decodes the command CMD received from the memory controller 30 and a mode register set (MRS) 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit, the second control signal CTL2 to the ECC engine 350 and a third control signal CTL3 to the row hammer management circuit 500. In addition, the command decoder 211 may generate internal command signals including the first refresh control signal IREF1, the second refresh control signal IREF2, an active signal IACT, a precharge signal IPRE, a read signal IRD and a write signal IWR by decoding the command CMD.

Figure 4:
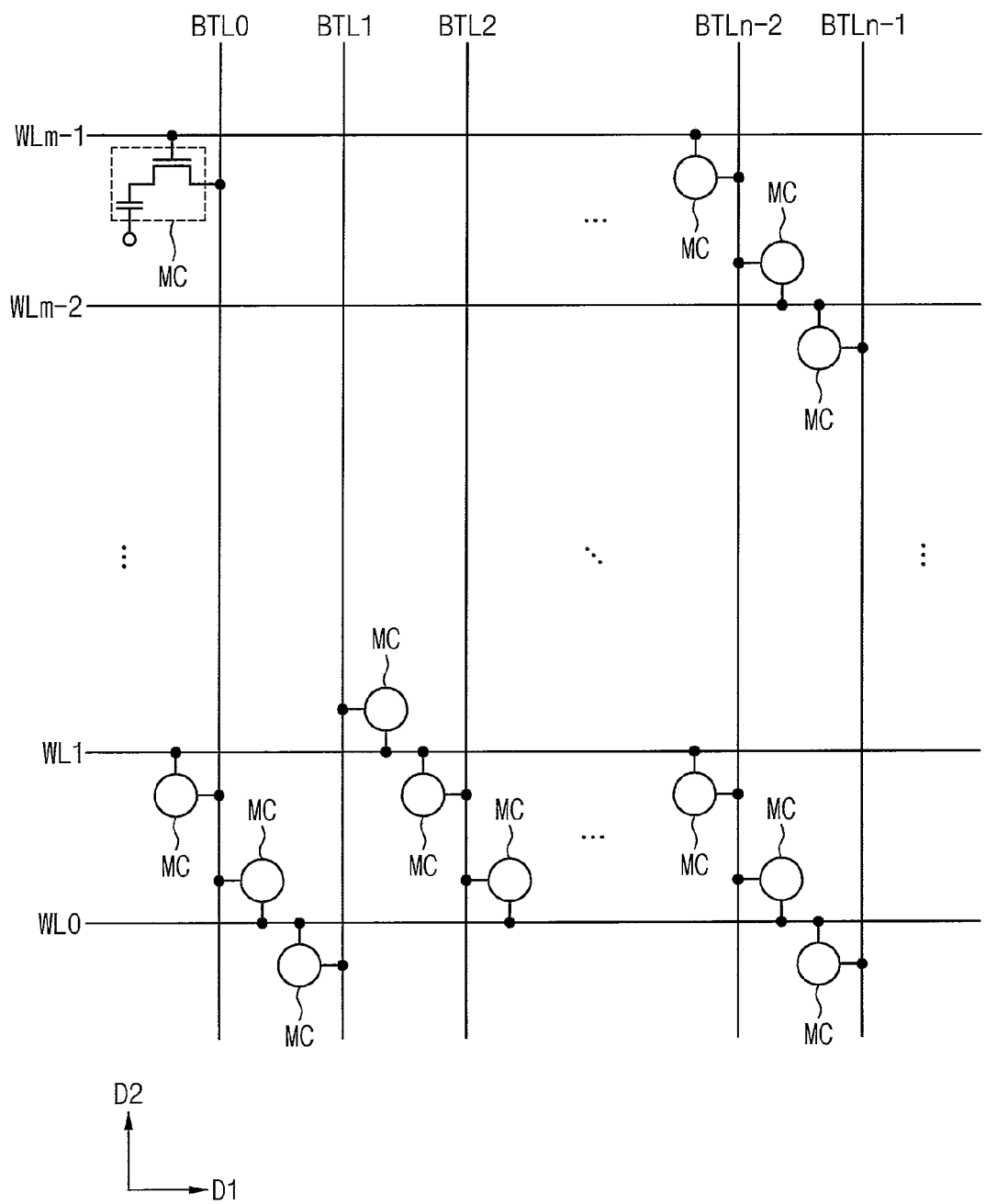
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a includes a plurality of word-lines WL0~WLm-1 (m is a natural number greater than two), a plurality of bit-lines BTL0~BTLn-1 (n is a natural number greater than two), and a plurality of memory cells MCs disposed at intersections between the word-lines WL0~WLm-1 and the bit-lines BTL0~BTLn-1. Each of the memory cells MCs includes a cell transistor coupled to each of the word-lines WL0~WLm-1 and each of the bit-lines BTL0~BTLn-1 and a cell capacitor coupled to the cell transistor. Each of the memory cells MCs may have a DRAM cell structure. Each of the word-lines WL0~WLm-1 extends in a first direction D1 and each of the bit-lines BTL0~BTLn-1 extend in a second direction D2 crossing the first direction D1.

The word-lines WL0~WLm-1 coupled to the plurality of memory cells MCs may be referred to as rows of the first bank array 310a and the bit-lines BTL0~BTLn-1 coupled to the plurality of memory cells MCs may be referred to as columns of the first bank array 310a.

Figure 5A:
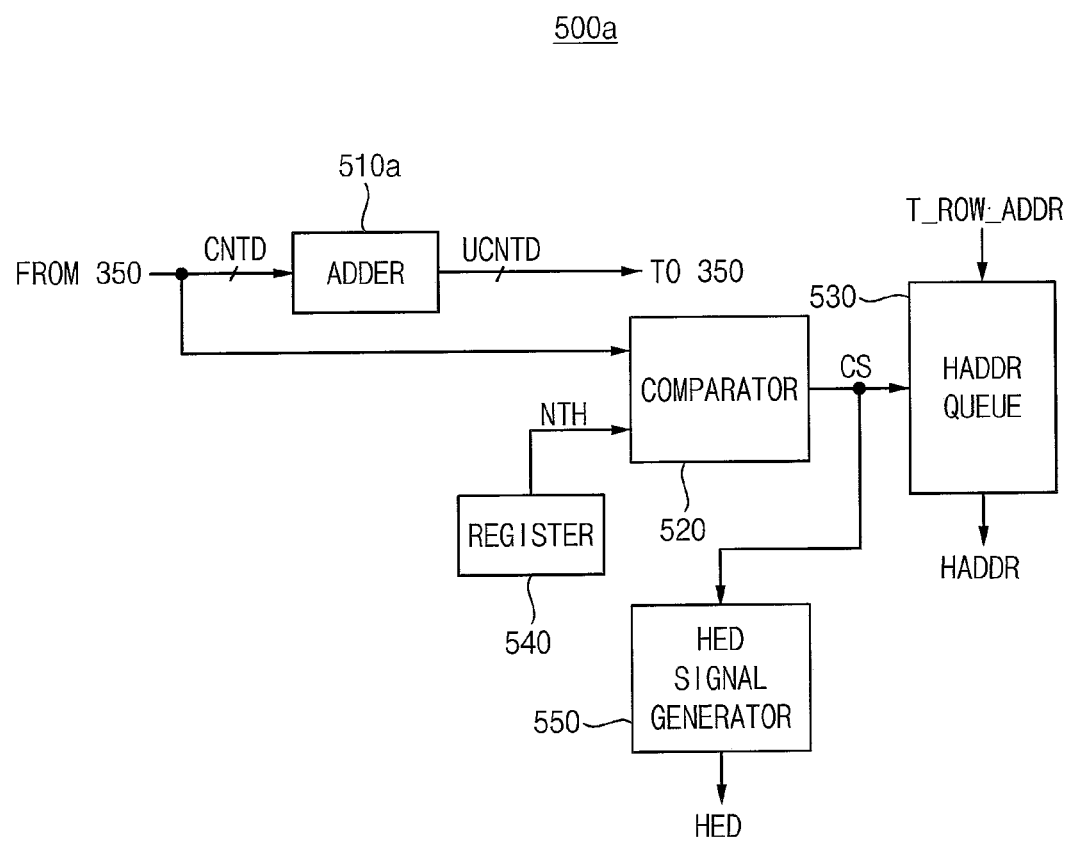
FIG. 5A is a block diagram illustrating an example of the row hammer management circuit in the semiconductor memory device of FIG. 3 according to example embodiments.

FIG. 5A is a block diagram illustrating an example of the row hammer management circuit in the semiconductor memory device of FIG. 3 according to example embodiments.

Referring to FIG. 5A, a row hammer management circuit 500a may include an adder 510a, a comparator 520, a hammer address queue 530, a register 540 and a hammer event detection (HED) signal generator 550.

The adder 510a updates the read count data CNTD read from the target memory cell row to provide an updated count data UCNTD by increase the count data CNTD by one, which is read from the ECC engine 350 after an ECC decoding operation is performed on the read count data CNTD. The adder 510a may update the read count data CNTD. The adder 510a may be implemented with an up-counter.

The updated count data UCNTD is provided to the ECC engine 350 and the ECC engine 350 performs an ECC encoding operation on the updated count data UCNTD.

The register 540 may store a reference number of times or a reference number NTH. For example, the reference number NTH may be predetermined. The comparator 520 may compare the read count data CNTD with the reference number NTH to output a comparison signal CS indicating a result of the comparison.

The hammer address queue 530 may store a target access address T_ROW_ADDR designating the target memory cell row in response to the comparison signal CS indicating that the read count data CNTD is equal to or greater than the reference number NTH and may provide the refresh control circuit 400 in FIG. 3 with the target access address T_ROW_ADDR as the hammer address HADDR.

The hammer event detection signal generator 550 may provide the refresh control circuit 400 in FIG. 3 with a hammer event detection signal HED indicating that a row hammer event occurs, in response to the comparison signal CS indicating that the read count data CNTD is equal to or greater than the reference number NTH.

Figure 5B:
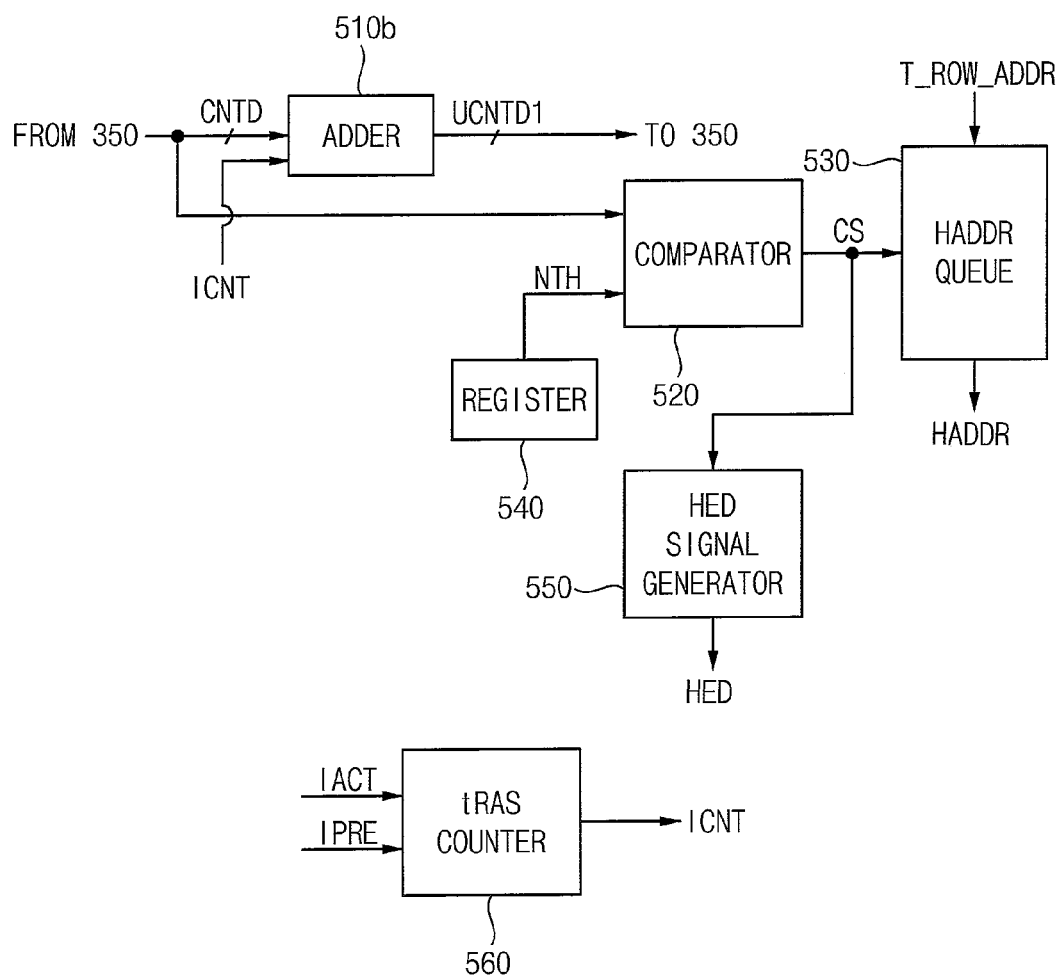
FIG. 5B is a block diagram illustrating an example of the row hammer management circuit in the semiconductor memory device of FIG. 3 according to example embodiments.

FIG. 5B is a block diagram illustrating an example of the row hammer management circuit in the semiconductor memory device of FIG. 3 according to example embodiments.

Referring to FIG. 5B, a row hammer management circuit 500b may include an adder 510b, a comparator 520, a hammer address queue 530, a register 540, a hammer event detection signal generator 550 and a (tRAS) counter 560.

The row hammer management circuit 500b of FIG. 5B differs from the row hammer management circuit 500a of FIG. 5A in that the row hammer management circuit 500b further includes the counter 560 and in an operation of the adder 510b.

The counter 560 may generate an interval counting value ICNT by staring counting operation in response to receiving the active signal IACT and ending the counting operation in response to receiving the precharge signal IPRE and may provide the interval counting signal ICNT to the adder 510b. Therefore, the interval counting value ICNT may represent an activation time interval tRAS of the target memory cell row. That is, the counter 560 may count a timing interval between the active command and the precharge command on the target memory cell row because the active signal IACT is associated with the active command and the precharge signal IPRE is associated with the precharge command.

The adder 510b may add the count data CNTD that is performed an ECC decoding operation on a read count data CNTD read from the target memory cell row and the interval counting value ICNT to provide an updated count data UCNTD1. For example, the count data CNTD is provided to the ECC engine 350 after the read count data CNTD is read from the target memory cell row and the ECC decoding operation is performed on the read count data CNTD. Therefore, the updated count data UCNTD1 may reflect the activation time interval tRAS of the target memory cell row. The updated count data UCNTD1 is provided to the ECC engine 350 and the ECC engine 350 performs an ECC encoding operation on the updated count data UCNTD1.

Therefore, the row hammer management circuit 500b may determine the hammer address HADDR by reflecting the activation time interval tRAS of the target memory cell row, and may prevent pass gate effect generated due to an enabled word-line (i.e., the target memory cell row).

Figure 6:
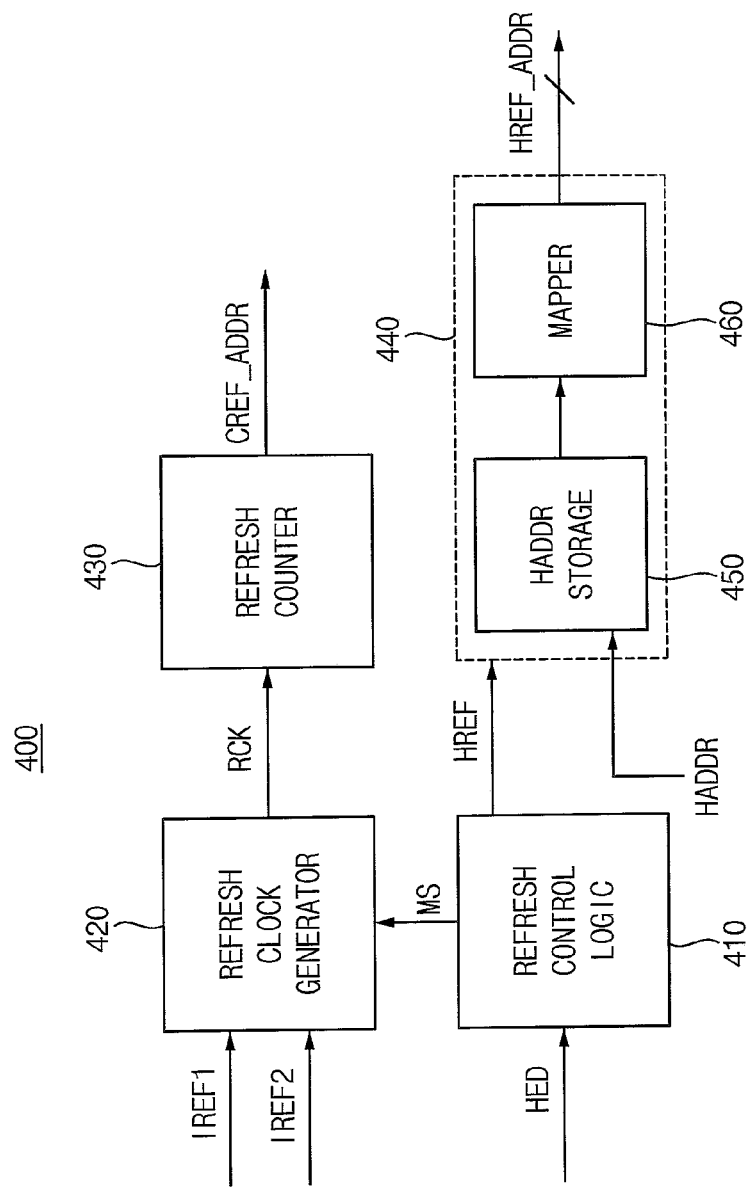
FIG. 6 is a block diagram illustrating an example of the refresh control circuit in FIG. 3 according to example embodiments.

FIG. 6 is a block diagram illustrating an example of the refresh control circuit in FIG. 3 according to example embodiments.

Referring to FIG. 6, the refresh control circuit 400 may include a refresh control logic 410, a refresh clock generator 420, a refresh counter 430 and a hammer refresh address generator 440.

The refresh control logic 410 may provide a mode signal MS in response to the hammer event detection signal HED In addition, the refresh control logic 410 may provide the hammer refresh address generator 440 with a hammer refresh signal HREF to control output timing of the hammer address in response to one of the first refresh control signal IREF1 and the second refresh control signal IREF2.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to the receiving the first refresh control signal IREF1 or during activation of the second refresh control signal IREF2.

When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3.

The hammer refresh address generator 440 may include a hammer address storage 450 and a mapper 460.

The hammer address storage 450 may store the hammer address HADDR and may output the hammer address HADDR to the mapper 460 in response to the hammer refresh signal HREF. The mapper 460 may generate one or more hammer refresh addresses HREF_ADDR designating one or more victim memory cell rows physically adjacent to a memory cell row corresponding to the hammer address HADDR.

The hammer refresh address generator 440 may provide the hammer refresh address HREF_ADDR as the refresh row address REF_ADDR to the row address multiplexer 240 in FIG. 3.

Figure 7:
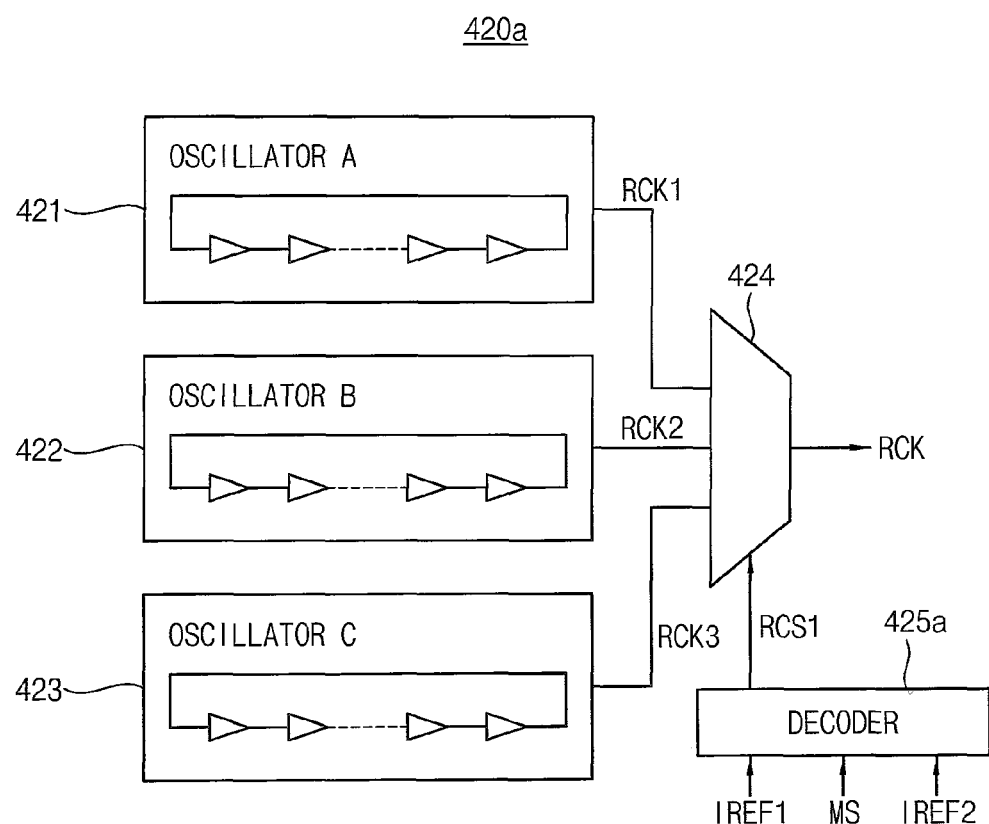
FIG. 7 is a circuit diagram illustrating an example of the refresh clock generator shown in FIG. 6 according to example embodiments.

FIG. 7 is a circuit diagram illustrating an example of the refresh clock generator shown in FIG. 6 according to example embodiments.

Referring to FIG. 7, a refresh clock generator 420a may include a plurality of oscillators 421, 422 and 423, a multiplexer 424 and a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1.

For example, because the mode signal MS indicates that the row hammer event occurs, the refresh clock generator 420a may adjust a refresh cycle by selecting one of the refresh clock signals RCK1, RCK2 and RCK3.

Figure 8:
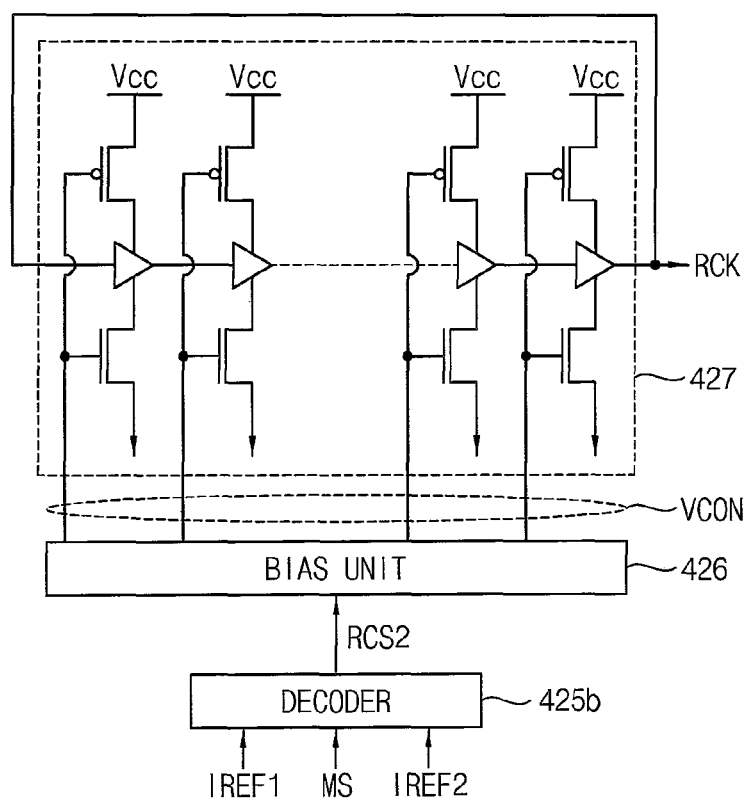
FIG. 8 is a circuit diagram illustrating another example of the refresh clock generator in FIG. 6 according to example embodiments.

FIG. 8 is a circuit diagram illustrating another example of the refresh clock generator in FIG. 6 according to example embodiments.

Referring to FIG. 8, a refresh clock generator 420b may include a decoder 425b, a bias unit 426 and an oscillator 427.

The decoder 425b may decode the first refresh control signal IREF1, the second refresh control signal IREF2 and the mode signal MS to output a clock control signal RCS2. The bias unit 426 generates a control voltage VCON in response to the clock control signal RCS2. The oscillator 427 generates the refresh clock signal RCK having a variable period, according to the control voltage VCON.

For example, because the mode signal MS indicates that the row hammer event occurs, the refresh clock generator 420b may adjust a refresh cycle by varying a period of the refresh clock signal RCK based on the clock control signal RCS2.

Figure 9:
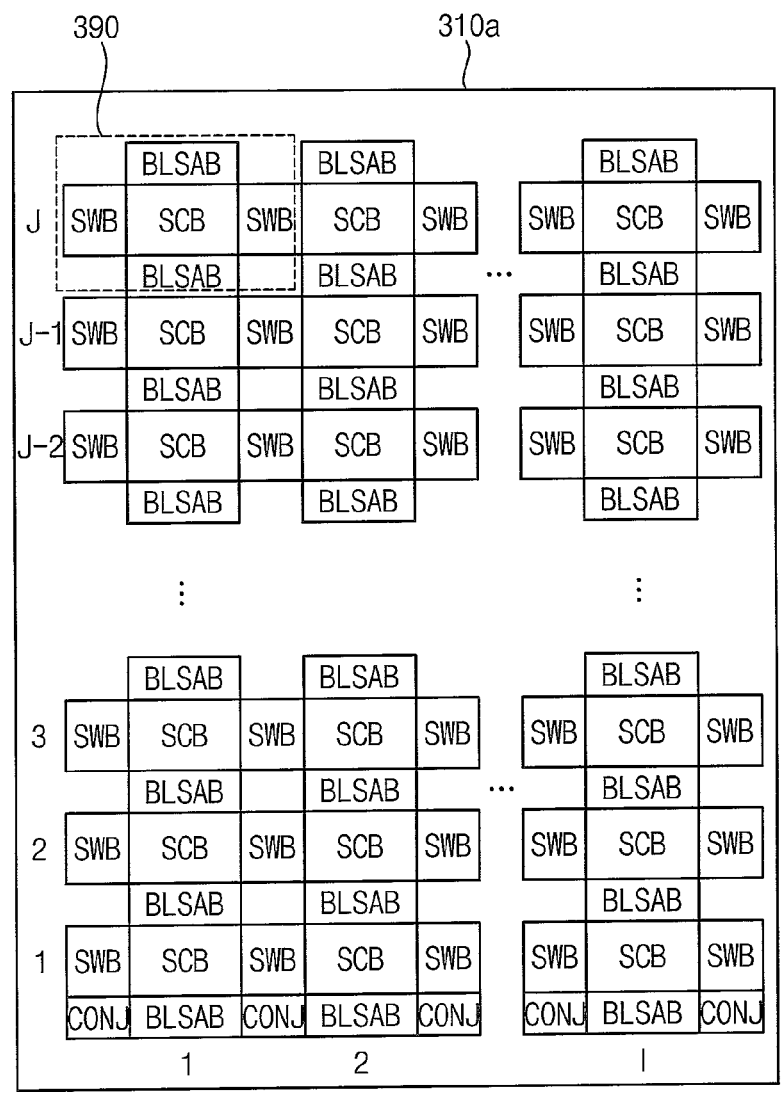
FIG. 9 illustrates an example of the first bank array in the semiconductor memory device of FIG. 3 according to some example embodiments.

FIG. 9 illustrates an example of the first bank array in the semiconductor memory device of FIG. 3 according to some example embodiments.

Referring to FIG. 9, in the first bank array 310a, I sub-array blocks SCB may be disposed in the first direction D1, and J sub-array blocks SCB may be disposed in the second direction D2 substantially perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator is disposed in each of the conjunction regions CONJ. A portion 390 in the first bank array 310a will be described with reference to FIG. 10 below.

Figure 10:
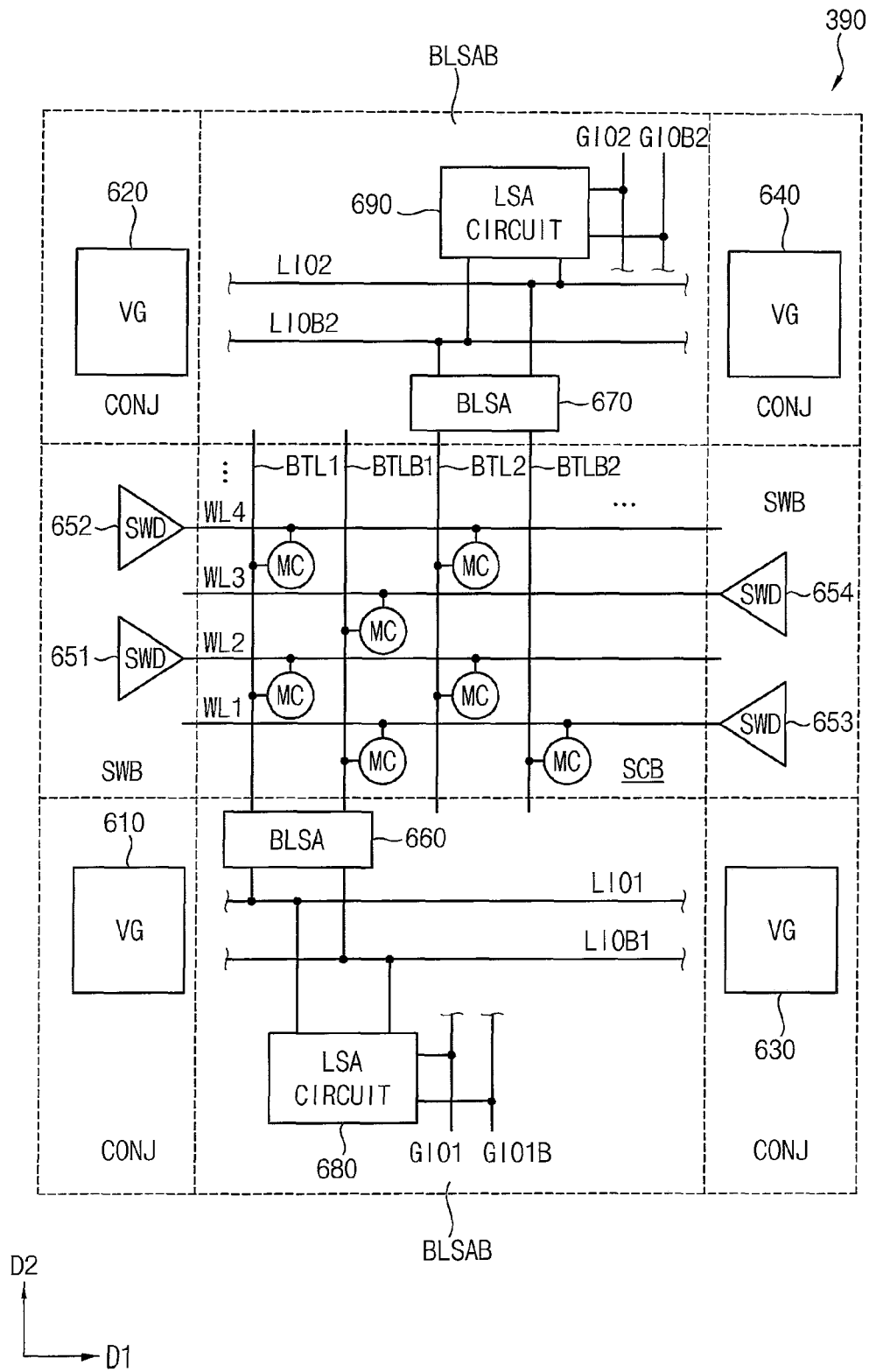
FIG. 10 illustrates a portion of the first bank array in FIG. 9 according to some example embodiments.

FIG. 10 illustrates a portion of the first bank array in FIG. 9 according to some example embodiments.

Referring to FIGS. 9 and 10, in the portion 390 of the first bank array 310a, the sub-array block SCB, two of the bit-line sense amplifier regions BLSAB, two of the sub word-line driver regions SWB and four of the conjunction regions CONJ are disposed.

The sub-array block SCB includes a plurality of word-lines WL1~WL4 extending in a row direction (the first direction D1) and a plurality of bit-line pairs BTL1/BTLB1 and BTL2/BTLB2 extending in a column direction (the second direction D2). The sub-array block SCB includes a plurality of memory cells MCs disposed at intersections of the word-lines WL1~WL4 and the bit-line pairs BTL1/BTLB1 and BTL2/BTLB2.

With reference to FIG. 10, the sub word-line driver regions SWB include a plurality of sub word-line drivers 651, 652, 653 and 654 that respectively drive the word-lines WL1~WL4. The sub word-line drivers 651 and 652 may be disposed in the sub word-line driver region SWB, which is leftward (in this example), with respect to the sub-array block SCB. In addition, the sub word-line drivers 653 and 654 may be disposed in the sub word-line driver region SWB, which is rightward (in this example), with respect to the sub-array block SCB.

The bit-line sense amplifier regions BLSAB include bit-line sense amplifiers 660 (BLSA) and bit-line sense amplifier 670 coupled to the bit-line pairs BTL1/BTLB1 and BTL2/BTLB2, and local sense amplifier circuits 680 and 690. The bit-line sense amplifier 660 may sense and amplify a voltage difference between the bit-line pair BTL1/BTLB1 to provide the amplified voltage difference to a local I/O line pair LIO1/LIOB1. The bit-line sense amplifier 670 may sense and amplify a voltage difference between the bit-line pair BTL2/BTLB2 to provide the amplified voltage difference to a local I/O line pair LIO2/LIOB2.

The local sense amplifier circuit 680 controls connection between the local I/O line pair LIO1/LIOB1 and a global I/O line pair GIO1/GIOB1. The local sense amplifier circuit 690 controls connection between the local I/O line pair LIO2/LIOB2 and a global I/O line pair GIO2/GIOB2.

As illustrated in FIG. 10, the bit-line sense amplifier 660 and the bit-line sense amplifier 670 may be alternately disposed at an upper portion and a lower portion of the sub-array block SCB. The conjunction regions CONJ are disposed adjacent to the bit-line sense amplifier regions BLSAB and the sub word-line driver regions SWB. The conjunction regions CONJ are also disposed at each corner of the sub-array block SCB in FIG. 10. A plurality of voltage generators 610, 620, 630 and 640 may be disposed in the conjunction regions CONJ.

Figure 11:
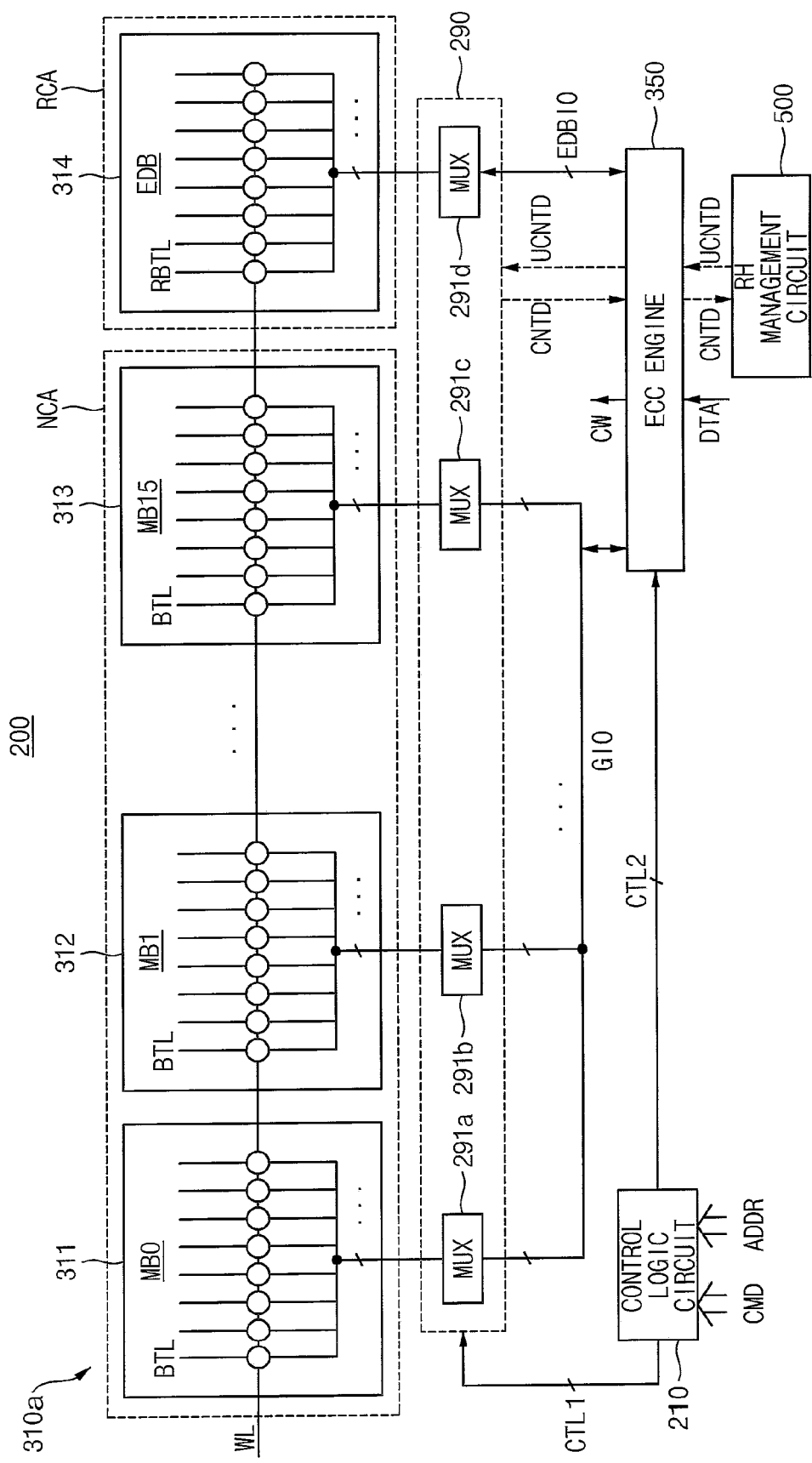
FIG. 11 illustrates a portion of the semiconductor memory device of FIG. 3 for explaining a write operation.

FIG. 11 illustrates a portion of the semiconductor memory device of FIG. 3 for explaining a write operation.

In FIG. 11, the control logic circuit 210, the first bank array 310a, the I/O gating circuit 290, the ECC engine 350 and the row hammer management circuit 500 are illustrated.

Referring to FIG. 11, the first bank array 310a includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. The first memory blocks 311~313 and the second memory block 314 may each be representative of a sub array block SCB in FIG. 9.

The I/O gating circuit 290 includes a plurality of switching circuits 291a~291d respectively connected to the first memory blocks 311~313 and the second memory block 314.

The ECC engine 350 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d and the second control signal CTL2 for controlling the ECC engine 350.

When the command CMD is a write command, the control logic circuit 210 provides the second control signal CTL2 to the ECC engine 350. The ECC engine 350 performs the ECC encoding on the data DTA to generate parity data associated with the data DTA and provides the I/O gating circuit 290 with the codeword CW including the data DTA and the parity data. The control logic circuit 210 provides the first control signal CTL1 to the I/O gating circuit 290 such that the codeword CW is to be stored in a sub-page of the target page in the first bank array 310a.

When the command CMD that is received after the write command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310a and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data C_CNTD to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 290.

The ECC engine 350 may perform an ECC decoding operation on the count data CNTD and may perform an ECC encoding operation on the updated count data UCNTD by masking the data DTA.

For example, the ECC engine 350 and row hammer management circuit 500 may perform the internal read-update-write operation to read the count data CNTD, to update the read count data and to write the updated count data, in response to the active count update command.

Figure 12:
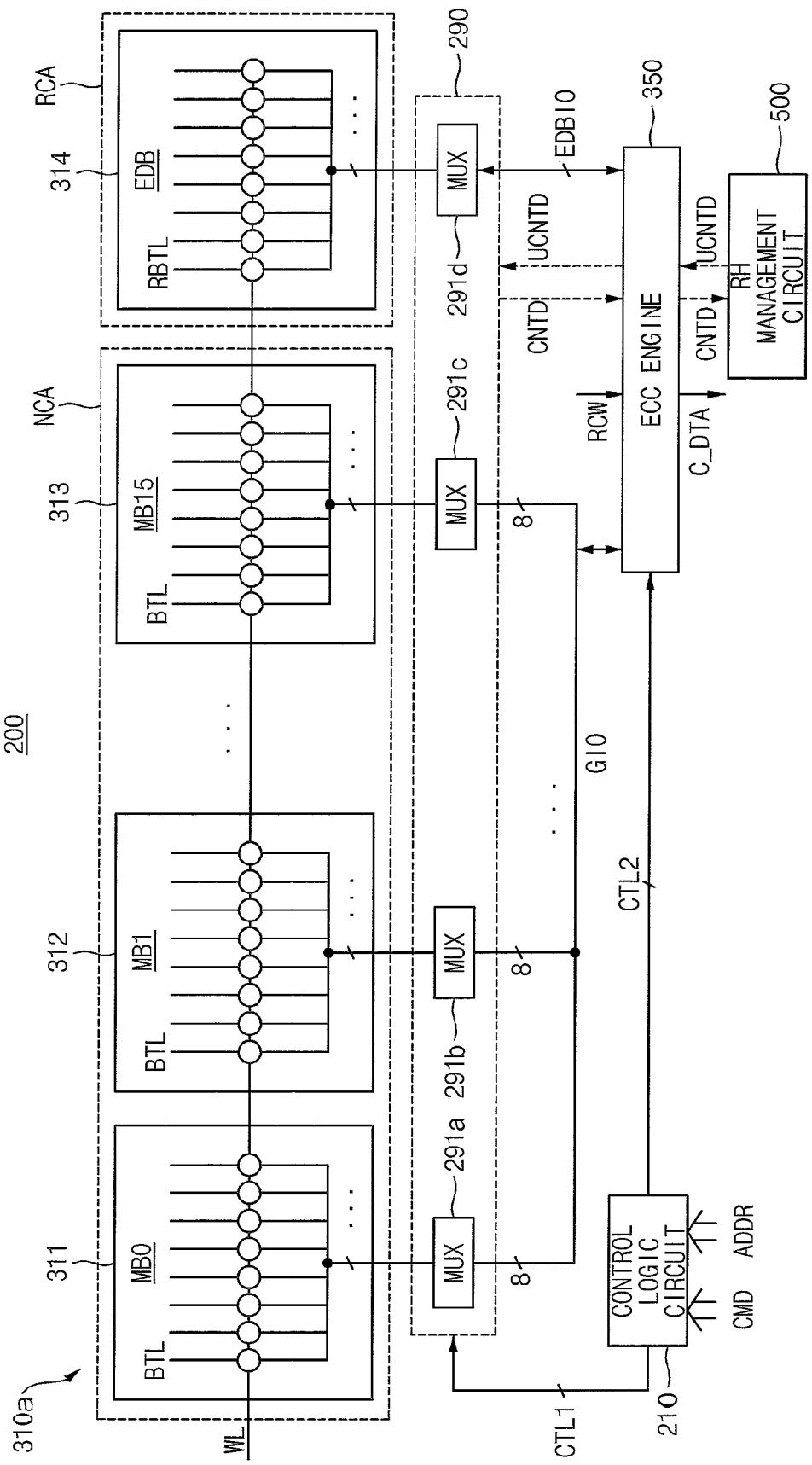
FIG. 12 illustrates a portion of the semiconductor memory device of FIG. 5 for explaining a read operation.

FIG. 12 illustrates a portion of the semiconductor memory device of FIG. 5 for explaining a read operation. Description repeated with FIG. 11 will be omitted.

Referring to FIG. 12, when the command CMD is a read command to designate a read operation, the control logic circuit 210 provides the first control signal CTL1 to the I/O gating circuit 290 such that a (read) codeword RCW stored in the sub-page of the target page in the first bank array 310a is provided to the ECC engine 350.

When the command CMD that is received after the write command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310a and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data C_CNTD to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 390.

The ECC engine 350 may perform an ECC decoding operation on the count data CNTD and may perform an ECC encoding operation on the updated count data UCNTD by masking the data DTA.

For example, the ECC engine 350 and row hammer management circuit 500 may perform the internal read-update-write operation to read the count data CNTD, to update the read count data and to write the updated count data, in response to the active count update command.

Figure 13:
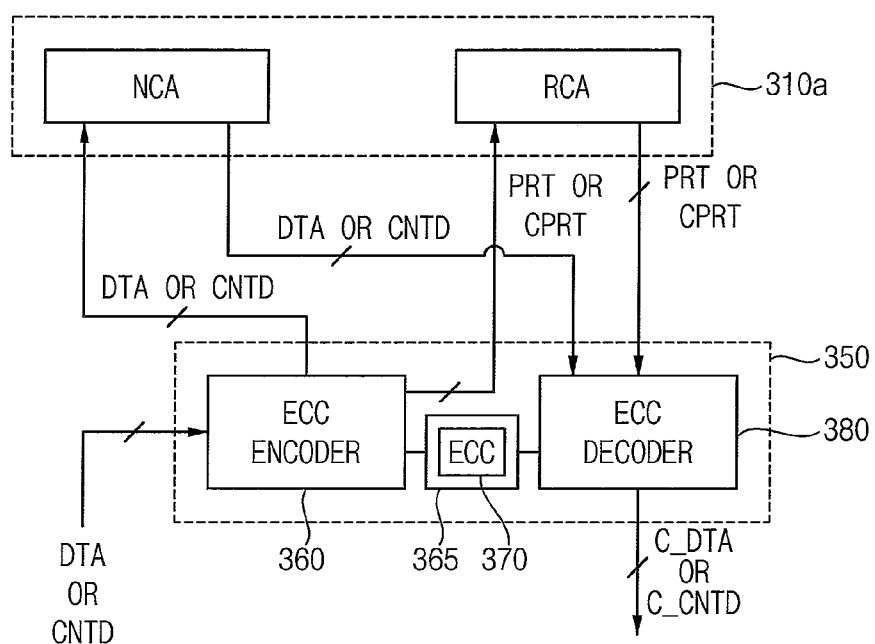
FIG. 13 is a block diagram illustrating an example of the ECC engine in the semiconductor memory device of FIG. 3 according to example embodiments.

FIG. 13 is a block diagram illustrating an example of the ECC engine in the semiconductor memory device of FIG. 3 according to example embodiments.

Referring to FIG. 13, the ECC engine 350 may include an ECC encoder 360, an ECC decoder 380 and a (ECC) memory 365. The memory 365 may store an ECC 370. The ECC 370 may be a single error correction (SEC) code or a single error correction/double error detection (SECDED) code.

The ECC encoder 360 may receive the data DTA from the data I/O buffer 320 and generate parity data PRT using the ECC 370, associated with the data DTA to be stored in the normal cell array NCA of the first bank array 310a. The parity data PRT may be stored in the redundancy cell array RCA of the first bank array 310a. In addition, the ECC encoder 360 may receive the count data CNTD as an updated count data UCNTD from the row hammer management circuit 500 and generate count parity data CPRT using the ECC 370, associated with the count data CNTD (i.e., updated count data UCNTD) to be stored in the normal cell array NCA of the first bank array 310a. The count parity data CPRT may be stored in the redundancy cell array RCA of the first bank array 310a.

The ECC decoder 380 may perform an ECC decoding operation on a read data RMD based on the read data RMD and the parity data PRT read from the first bank array 310a using the ECC 370. When the read data RMD includes an error bit as a result of the ECC decoding, the ECC decoder 380 may correct the error bit in the read data RMD and may provide a corrected data C_DTA to the data I/O buffer 320.

In addition, the ECC decoder 380 may perform an ECC decoding operation on the count data CNTD based on the count data CNTD and the count parity data CPRT read from the first bank array 310a using the ECC 370. When the count data CNTD includes an error bit as a result of the ECC decoding, the ECC decoder 380 may correct the error bit in the count data CNTD and may provide a corrected count data C_CNTD to the row hammer management circuit 500.

FIGS. 14 through 16 illustrate example commands which may be used in the memory system of FIG. 1.

FIG. 14 illustrates combinations of a chip selection signal CS_n and first through fourteenth command-address signals CA0~CA13 representing an active command ACT, a write command WR and a read command RD, FIG. 15 illustrates combinations of the chip selection signal CS_n and the first through fourteenth command-address signals CA0~CA13 representing a write command WRA including an auto precharge and a read command RDA including an auto precharge, and FIG. 16 illustrates combinations of the chip selection signal CS_n and the first through fourteenth command-address signals CA0~CA13 representing precharge commands PREab, PREsb and PREpb.

In FIGS. 14 through 16, H indicates a logic high level, L indicates a logic low level, V indicates a valid logic level corresponding to one of the logic high level H and the logic low level L, R0~R17 indicate bits of a row address, BA0 through BA2 indicate bits of a bank address, BG0 through BG2 indicate bits of a bank group address, and CID0 through CID3 indicate die identifier of a memory die (or a memory chip) when the semiconductor memory device 200 is implemented with a stacked memory device including a plurality of memory dies. In addition, in FIGS. 14 and 15, C2~C10 indicate bits of a column address, in FIG. 14, BL indicates burst length flag and in FIG. 15, AP indicates auto precharge flag.

Referring to FIG. 14, the active command ACT, the write command WR and the read command RD may be transferred during two cycles, for example, during the logic high level H and the logic low level L of the chip selection signal CS_n. The active command ACT may include the bank address bits BA0 and BA1 and the row address bits R0~R17.

Referring to FIG. 15, the write command WRA including an auto precharge and the read command RDA including an auto precharge may be transferred during two cycles, for example, during the logic high level H and the logic low level L of the chip selection signal CS_n, and may include the bank address bits BA0 and BA1 and the column address bits C3~C10 or C2~C10. Either the tenth command-address signal CA9 or the eleventh command-address signal CA10 of the write command WRA including an auto precharge and the read command RDA including an auto precharge may be used as an active count update flag.

In FIG. 16, PREpb is a precharge command to precharge a particular bank in a particular bank group, PREab is an all bank precharge command to precharge all banks in all bank groups and PREsb is a same bank precharge command to precharge the same bank in all bank groups.

Referring to FIG. 16, the ninth command-address signal CA8 or the tenth command-address signal CA9 of each of the precharge commands PREab and PREsb may be uses as an active count update flag.

Figure 17:
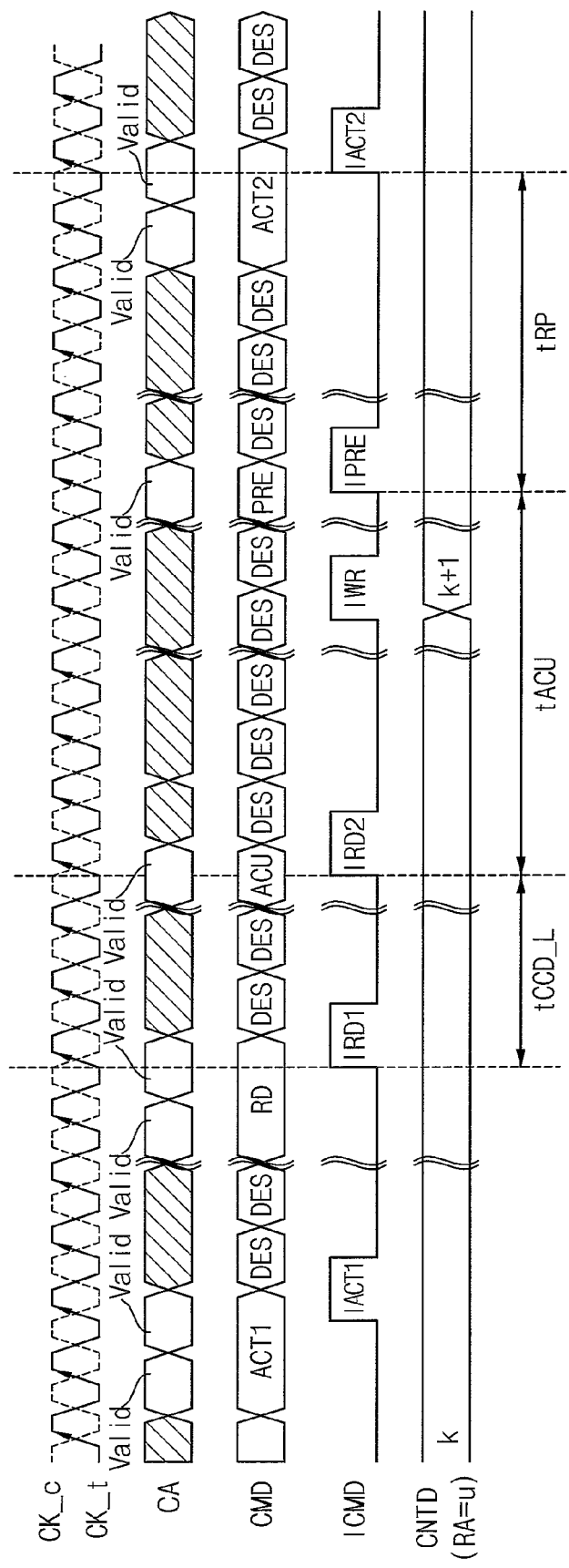
FIGS. 17 and 18 illustrate examples of command protocols of the memory system when the memory system uses the active count update command, respectively.
Figure 18:
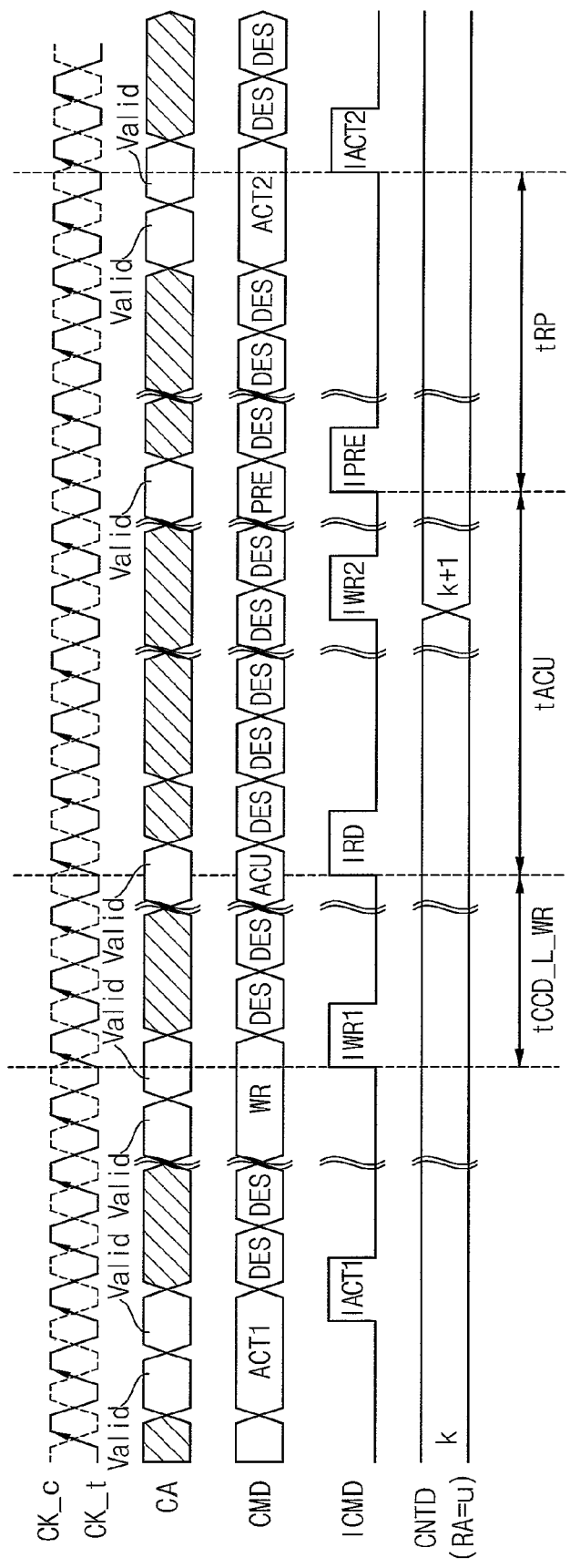

FIGS. 17 and 18 illustrate examples of command protocols of the memory system when the memory system uses the active count update command, respectively.

In FIGS. 17 and 18, differential clock signal pair CK_t and CK_c are illustrated.

Referring to FIGS. 1, 2, 3 and 17, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a read command RD designating a read operation on the first target memory cell row to the semiconductor memory device 200 in synchronization with an edge of the clock signal CK_t. The control logic circuit 210, in response to the read command RD, performs a read operation on data stored in the first target memory cell row by enabling a first read signal IRD1.

After a time interval corresponding to a delay time of consecutive read commands to the same bank group tCCD_L from applying the read command RD, the scheduler 55 applies an active count update command ACU to the semiconductor memory device 200 in synchronization with an edge of the clock signal CK_t and the control logic circuit 210 reads the count data CNTD from the first target memory cell row, updates the read count data CNTD and stores the updated count data in the first target memory cell row by sequentially enabling a second read signal IRD2 and a write signal IWR in response to the active count update command ACU. Therefore, bit values stored in the first target memory cell row designated by the first target row address (e.g., RA=u) is increased by one from k to k+1.

After a time interval corresponding to a time tACU of performing the internal read-update-write operation from applying the active count update command ACU, the scheduler 55 applies a precharge command PRE to the semiconductor memory device 200 and the control logic circuit 210, in response to the precharge command PRE, precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

Referring to FIGS. 1, 2, 3 and 18, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT1.

After applying the first active command ACT1, the scheduler 55 applies a write command WR designating a write operation on the first target memory cell row to the semiconductor memory device 200 in synchronization with an edge of the clock signal CK_t. The control logic circuit 210, in response to the write command WR, performs a write operation to store data in the first target memory cell row by enabling a first write signal IWR1.

After a time interval corresponding to a delay time of consecutive write commands to the same bank group tCCD_L_WR from applying the write command WR, the scheduler 55 applies an active count update command ACU to the semiconductor memory device 200 in synchronization with an edge of the clock signal CK_t and the control logic circuit 210 reads the count data CNTD from the first target memory cell row, updates the read count data CNTD and stores the updated count data in the first target memory cell row by sequentially enabling a read signal IRD and a second write signal IWR2 in response to the active count update command ACU. Therefore, bit values stored in the first target memory cell row designated by the first target row address (e.g., RA=u) is increased by one from k to k+1.

After a time interval corresponding to a time tACU of performing the internal read-update-write operation from applying the active count update command ACU, the scheduler 55 applies a precharge command PRE to the semiconductor memory device 200 and the control logic circuit 210, in response to the precharge command PRE, precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT2.

Figure 19:
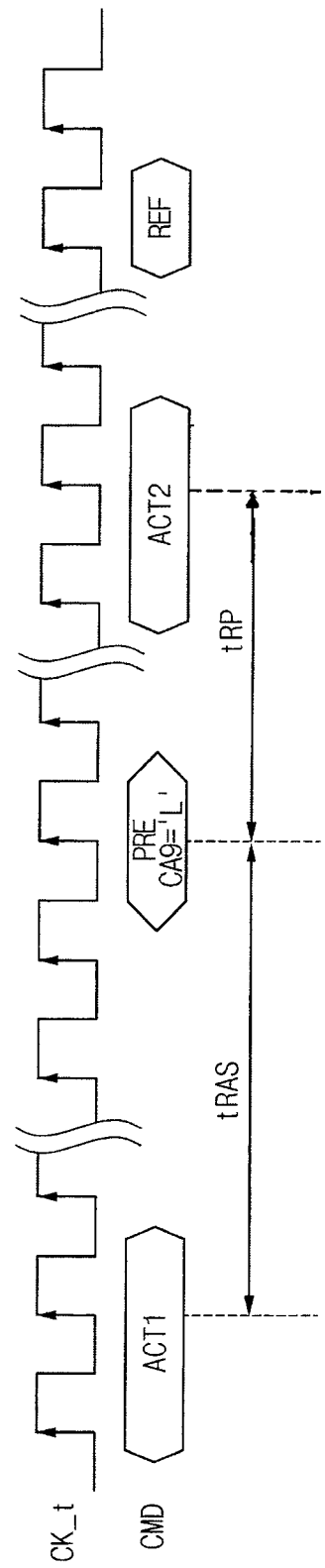
FIG. 19 illustrates an example of the command protocol of the memory system when the memory system updates the count data based on the precharge command.

FIG. 19 illustrates an example of the command protocol of the memory system when the memory system updates the count data based on the precharge command.

Referring to FIGS. 1, 2, 16 and 19, the scheduler 55 applies the first active command ACT1 to the semiconductor memory device 200 in synchronization with an edge of the clock signal CK_t, and applies the precharge command PRE designating an internal read-update-write operation on the count data stored in a target memory cell designated by a target row address accompanied by the first active command ACT1 to the semiconductor memory device 200 after a tRAS corresponding to active to precharge time elapses. In this case, the scheduler 55 may set the tenth command-address signal CA9 of the precharge command PRE to a logic low level L. Although not shown in FIG. 19, the scheduler 55 may apply a read command or a write command to the semiconductor memory device 200 in synchronization with an edge of the clock signal CK_t.

After a time interval corresponding to precharge time tRP, the scheduler 55 applies a second active command ACT2 to the semiconductor memory device 200 in synchronization with an edge of the clock signal CK_t and applies a refresh command REF to the semiconductor memory device 200. The semiconductor memory device 200 performs a hammer refresh operation on one or more victim memory cell rows physically adjacent to a memory cell row corresponding to the hammer address, in response to the refresh command REF.

Figure 20:
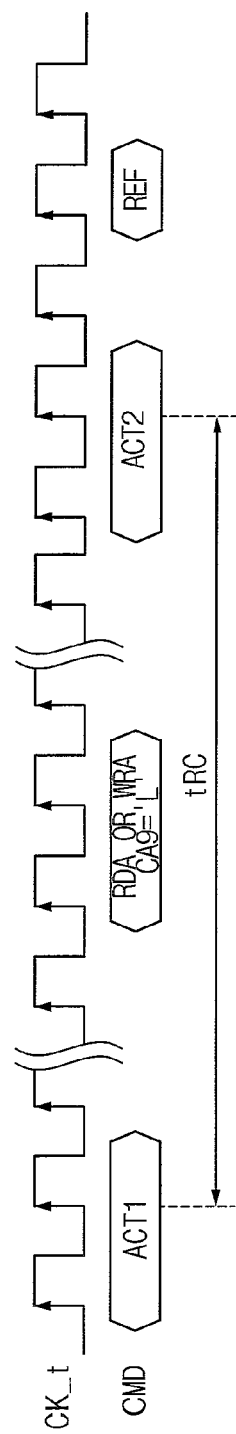
FIG. 20 illustrates an example of the command protocol of the memory system when the memory system updates the count data based on the read command including an auto precharge or the write command including an auto precharge.

FIG. 20 illustrates an example of the command protocol of the memory system when the memory system updates the count data based on the read command including an auto precharge or the write command including an auto precharge.

Referring to FIGS. 1, 2, 15 and 20, the scheduler 55 applies the first active command ACT1 to the semiconductor memory device 200 in synchronization with an edge of the clock signal CK_t, and applies the read command RDA including an auto precharge or the write command WRA including an auto precharge designating an internal read-update-write operation on the count data stored in a target memory cell designated by a target row address accompanied by the first active command ACT1 to the semiconductor memory device 200. In this case, the scheduler 55 may set the tenth command-address signal CA9 of the read command RDA including an auto precharge or the write command WRA including an auto precharge to a logic low level L. The row hammer management circuit 500 may perform the internal read-update-write operation in response to the logic low level L of the tenth command-address signal CA9.

After a time interval corresponding to active to active time tRC from applying the first active command ACT1, the scheduler 55 applies a second active command ACT2 to the semiconductor memory device 200 and applies a refresh command REF to the semiconductor memory device 200. The semiconductor memory device 200 performs a hammer refresh operation on one or more victim memory cell rows physically adjacent to a memory cell row corresponding to the hammer address, in response to the refresh command REF.

In FIG. 20, the scheduler 55 may selectively apply the read command RDA including an auto precharge or the write command WRA including an auto precharge to the semiconductor memory device 200.

Figure 21:
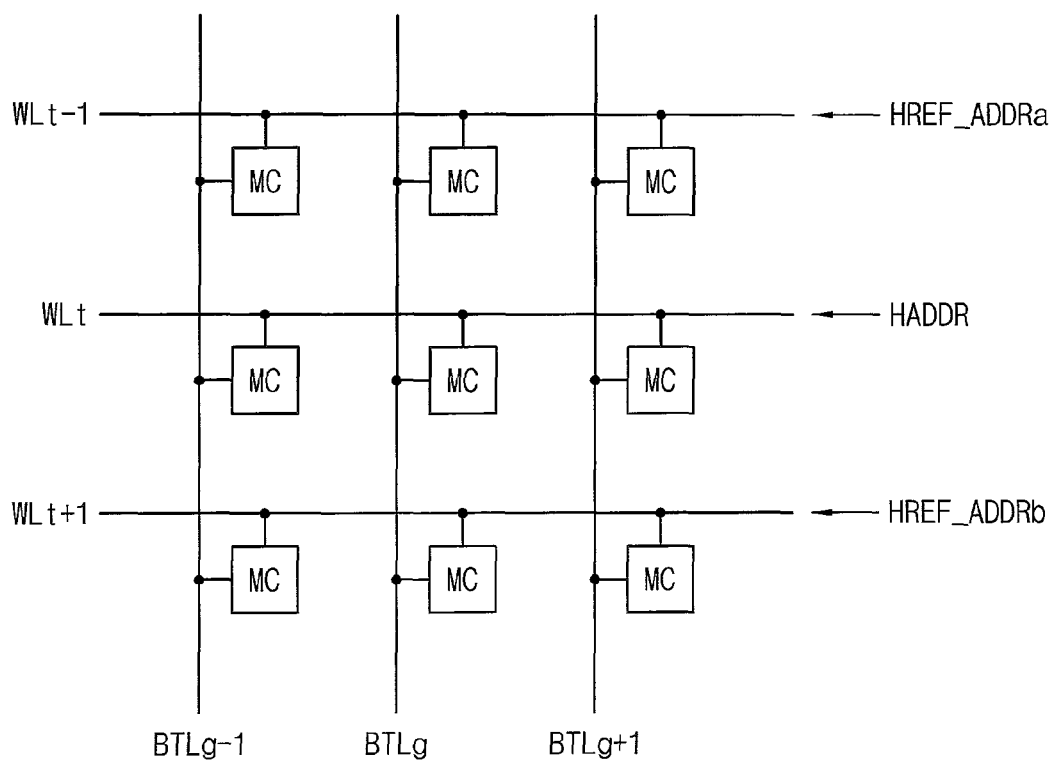
FIG. 21 is a diagram illustrating a portion of a memory cell array for describing generation of hammer refresh addresses.

FIG. 21 is a diagram illustrating a portion of a memory cell array for describing generation of hammer refresh addresses.

FIG. 21 illustrates three word-lines WLt−1, WLt and WLt+1, three bit-lines BTLg−1, BTLg and BTLg+1 and memory cells MC coupled to the word-lines WLt−1, WLt and WLt+1 and the bit-lines BTLg−1, BTLg and BTLg+1 in the memory cell array. The three word-lines WLt−1, WLt and WLt+1 are extended in a row direction (i.e., D1 direction) and arranged sequentially along a column direction (i.e., D2 direction). The three bit-lines BTLg−1, BTLg and BTLg+1 are extended in the column direction and arranged sequentially along the row direction. It will be understood that the word-lines WLt−1 and WLt are physically directly adjacent to each other since there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher activation number and/or has a relatively higher activation frequency. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer refresh address generator 440 in FIG. 6 may provide the HREF_ADDR representing the addresses HREF_ADDRa and HREF-ADDRb of the rows (e.g., the word-lines WLt−1 and WLt+1) that are physically adjacent to the row of the hammer address HADDR (e.g., the hammer word-line WLt), and an refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 22:
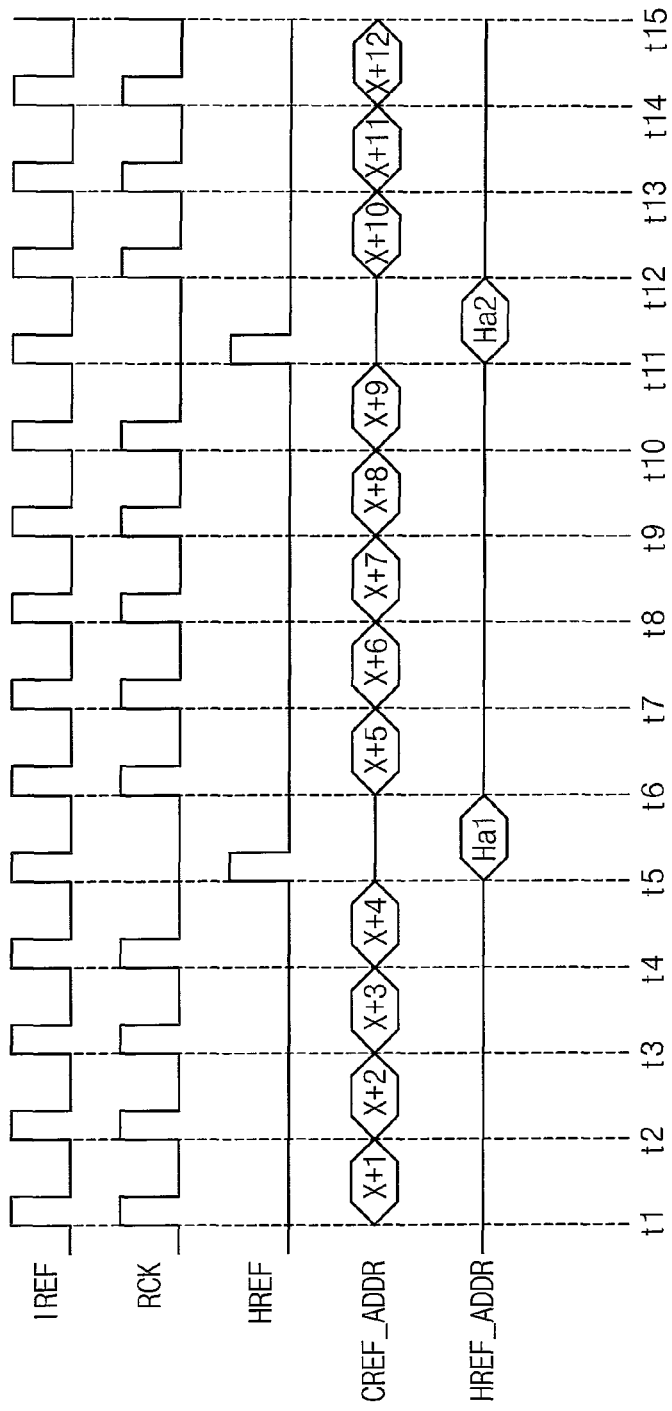
FIGS. 22 and 23 are timing diagrams illustrating example operations of a refresh control circuit of FIG. 6 according to example embodiments.
Figure 23:
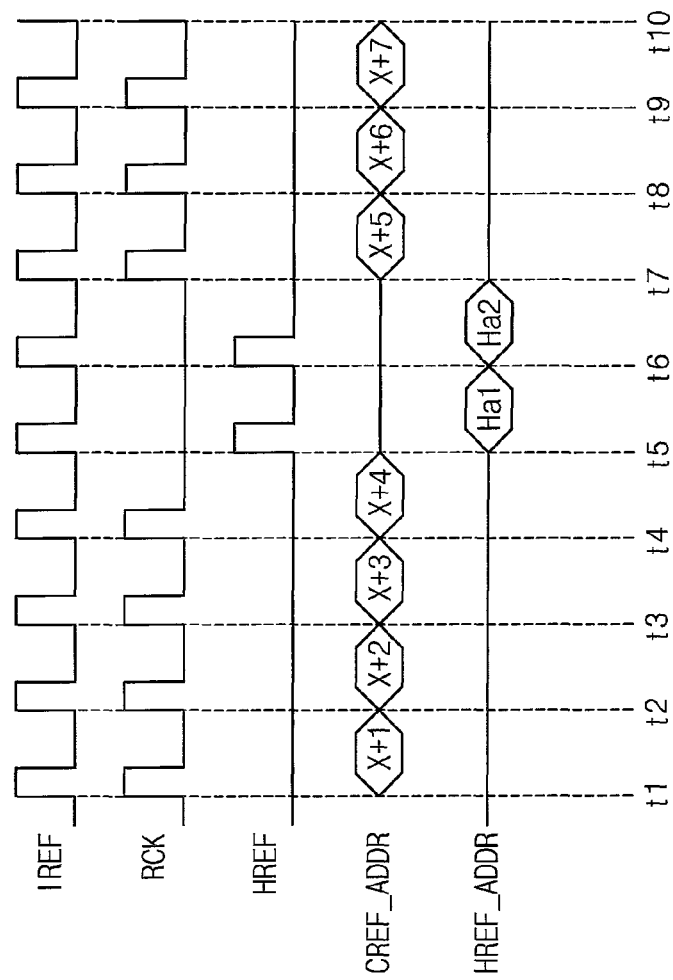

FIGS. 22 and 23 are timing diagrams illustrating example operations of a refresh control circuit of FIG. 6 according to example embodiments.

FIGS. 22 and 23 illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape. The intervals between the activation time points t1~t15 of the refresh control signal IREF may be regular or irregular.

Referring to FIGS. 6 and 22, the refresh control logic 410 may activate the refresh clock signal RCK in synchronization with some time points t1~t4, t6~t10 and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+15 in synchronization with the activation time points t1~t4, t6~t10 and t12~t15 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 6 and 23, the refresh control logic 410 may activate the refresh clock signal RCK in synchronization with some time points t1~t4 and t7~t10 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+11 in synchronization with the activation time points t1~t4 and t7~t10 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Figure 24:
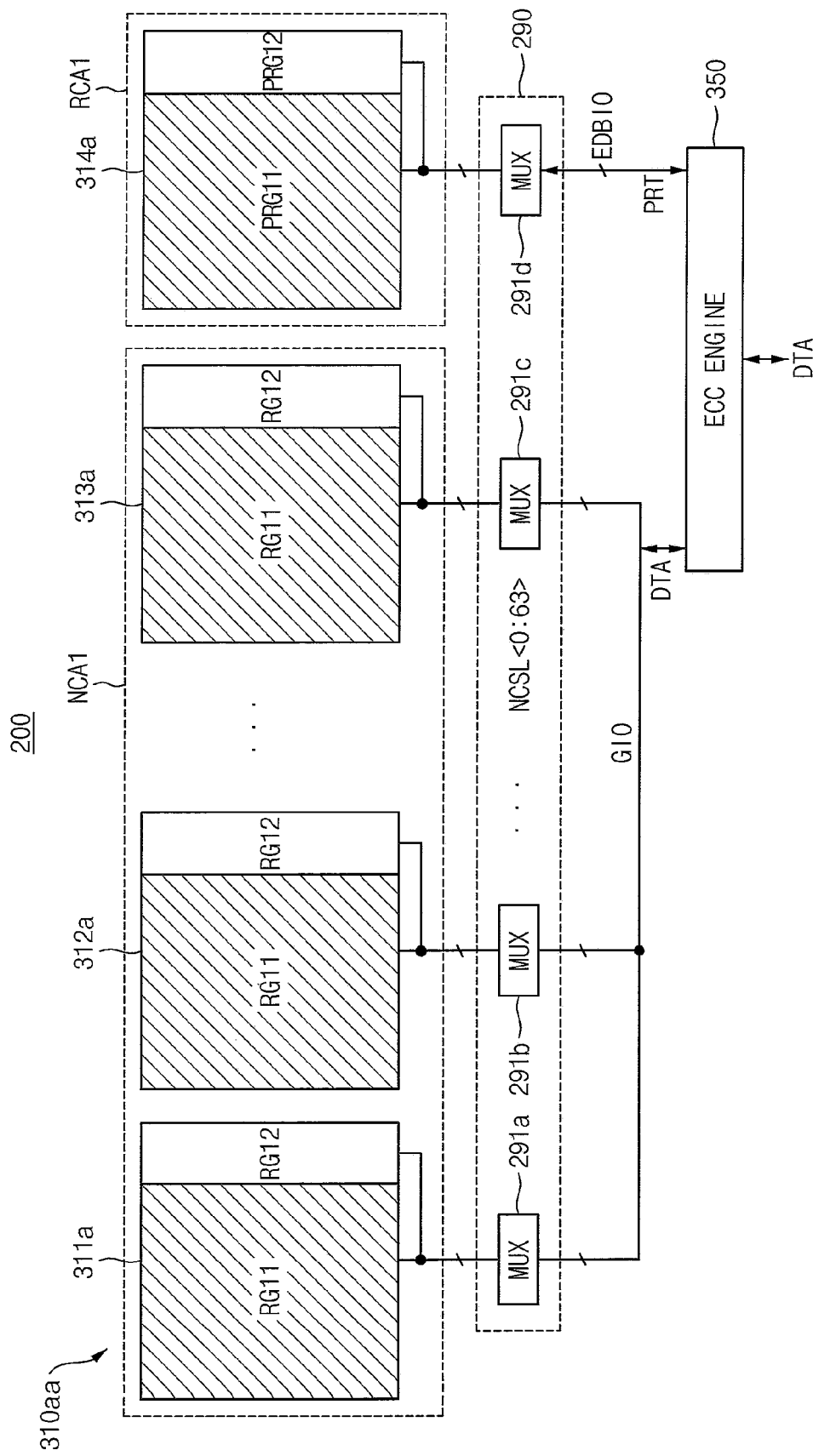
FIGS. 24 to 26 illustrate a portion of the semiconductor memory device of FIG. 3 respectively.
Figure 25:
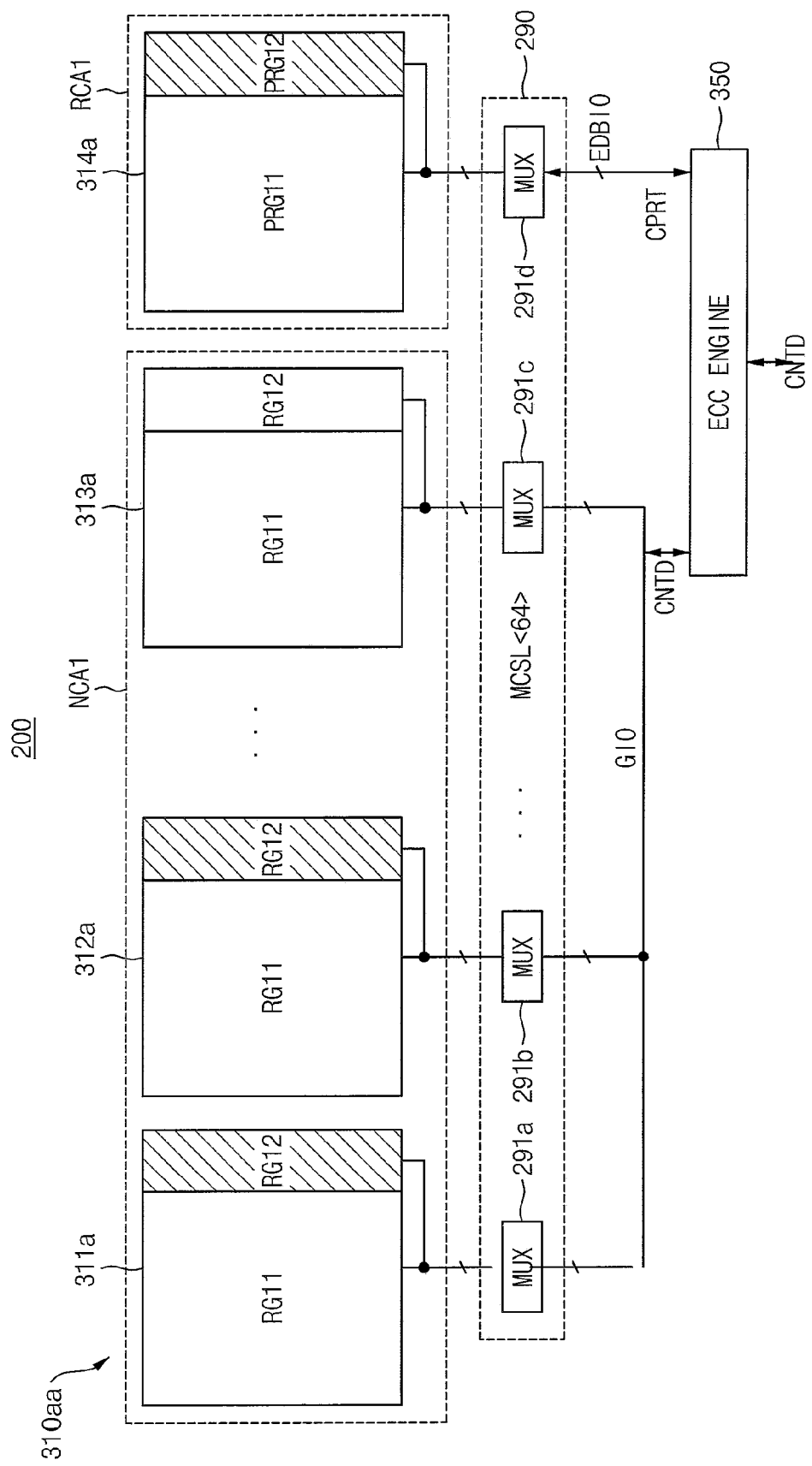
Figure 26:
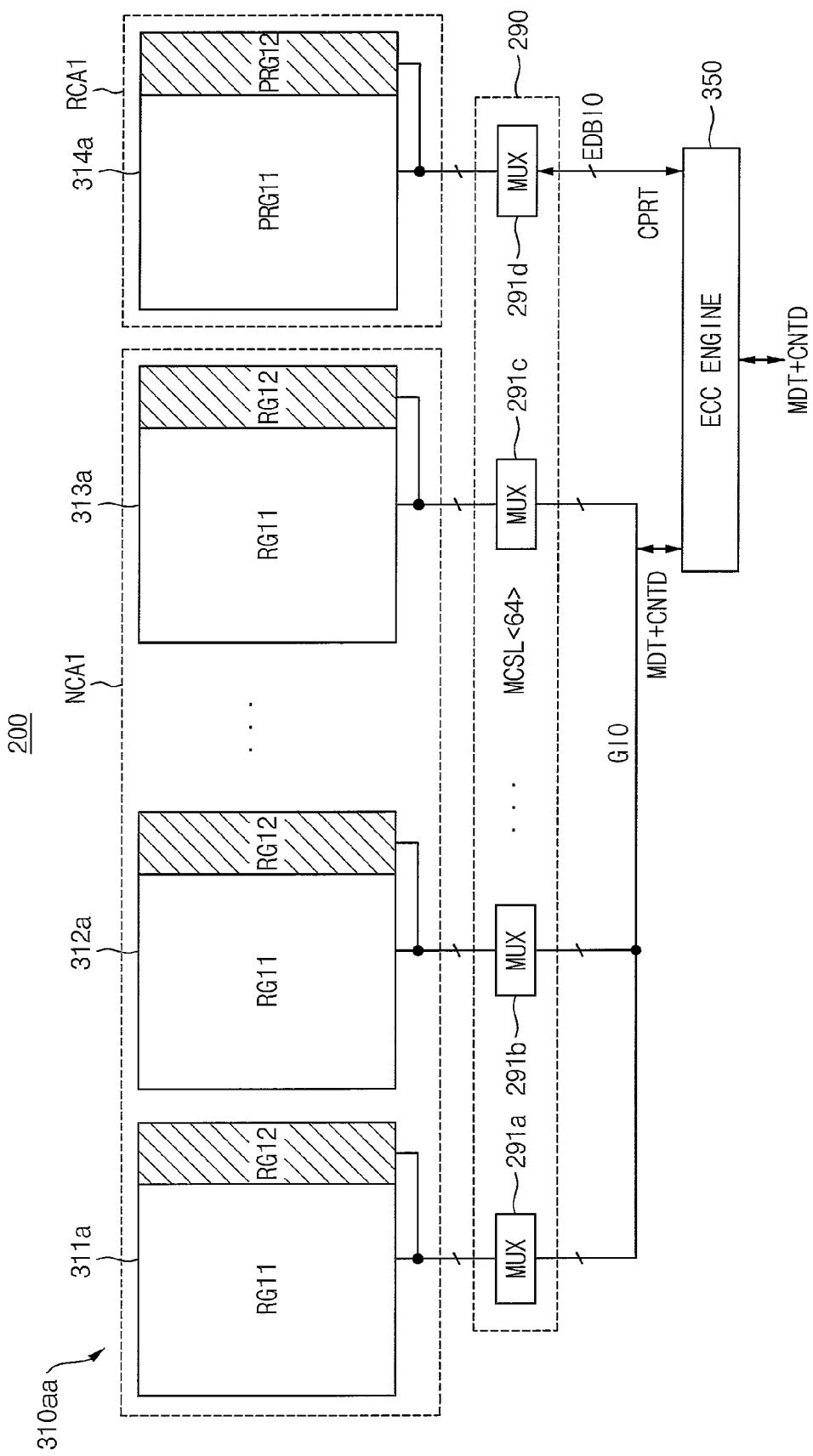

FIGS. 24 to 26 illustrate a portion of the semiconductor memory device of FIG. 3 respectively.

In each of FIGS. 24 to 26, the control logic circuit 210, a first bank array 310aa, the I/O gating circuit 290 and the ECC engine 350 are illustrated.

Referring to FIGS. 24 to 26, the first bank array 310aa includes a normal cell array NCA1 and a redundancy cell array RCA1. The normal cell array NCA1 includes a plurality of first memory blocks 311a~313a, and the redundancy cell array RCA1 includes at least a second memory block 314a. The first memory blocks 311a~313a and the second memory block 314a may each be representative of a sub array block SCB in FIG. 9.

In some examples, each of the first memory blocks 311a~313a may include a first region RG11 and a second region RG12 and the second memory block 314a may include a first region PRG11 and a second region PRG12. In some examples, at least one of the first memory blocks 311a~313a may include the first region RG11 and the second region RG12, and the others of the first memory blocks 311a~313a may include only the first region RG11 without the second region RG12.

Referring to FIG. 24, in a normal write operation or in a normal read operation of the semiconductor memory device 200, the data DTA is written to or read from the first region RG11 in each of the first memory blocks 311a~313a and the parity data PRT is written to or read from the first region PRG11 in the second memory block 314a using a normal column selection lines NCSL<0:63>. For example, in the normal write operation, the ECC engine 350 may provide the data DTA to the first region RG11 in each of the first memory blocks 311a~313a, and provide the parity data PRT to the first region PRG11 in the second memory block 314a. In the normal read operation, the ECC engine 350 may receive the data DTA from the first region RG11 in each of the first memory blocks 311a~313a and the parity data PRT from the first region PRG11 in the second memory block 314a, and provide the corrected data C_DTA to the data I/O buffer 320.

Referring to FIG. 25, in a count data update operation of the semiconductor memory device 200, using an additional column selection line MCSL<64>, the count data CNTD is written to or read from the second region RG12 in a portion (e.g., first memory blocks 311a and 312a) of the first memory blocks 311a~313a and the count parity data CPRT is written to or read from the second region PRG12 in the second memory block 314a.

In example embodiments, the count data CNTD may be stored in the second regions RG12 of the first memory blocks 311a and 312a and a meta data MDT (in FIG. 26) may be stored in the second region RG12 of the first memory block 313a. In this case, each of the memory cell rows included in the first region RG11 of each of the first memory blocks 311a and 312a may correspond to each of the memory cell rows included in the second region RG12 of each of the first memory blocks 311a and 312a. For example, the number of memory cell rows included in the first region RG11 of each of the first memory blocks 311a and 312a may be the same as the number of memory cell rows included in the second region RG12 of each of the first memory blocks 311a and 312a. Accordingly, the number of times of access associated with each of the plurality of memory cell rows included in the first region RG11 of each of the first memory blocks 311a~313a may be stored in the second regions RG12 of the first memory blocks 311a and 312a as count data. In an embodiment, the number of memory cells arranged in one memory cell row included in the second region RG12 of each of the first memory blocks 311a and 312a may be 8.

Also, memory cell rows included in the first region PRG11 of the second memory block 314a may correspond to memory cell rows included in the second region PRG12 of the second memory block 314a. For example, the number of memory cell rows included in the first region PRG11 of the second memory block 314a may be the same as the number of memory cell rows included in the second region PRG12 of the second memory block 314a.

In example embodiments, the count data CNTD may be stored only in the second region RG12 of the first memory block 311a from among the first memory blocks 311a~313a. In an embodiment, the number of memory cells arranged in one memory cell row included in the second region RG12 of the first memory block 311a may be 16.

Referring to FIG. 26, in a count data update operation of the semiconductor memory device 200, using the additional column selection line MCSL<64>, the meta data MDT and the count data CNTD is written to or read from the second region RG12 in each of the first memory blocks 311a~313a and the count parity data CPRT is written to or read from the second region PRG12 in the second memory block 314a. Herein, the meta data MDT may be referred to as data that is structured reference data that helps to sort and identify attributes of the information it describes. The meta data may summarize basic information about data, which can make it easier to find, use and reuse particular instances of data. For example, author, date created, date modified and file size are examples of very basic document file meta data. Having the ability to search for a particular element (or elements) of that meta data makes it much easier for someone to locate a specific document. The metadata may be used for computer files, images, relational databases, spreadsheets, videos, audio files, web pages, etc.

Figure 27:
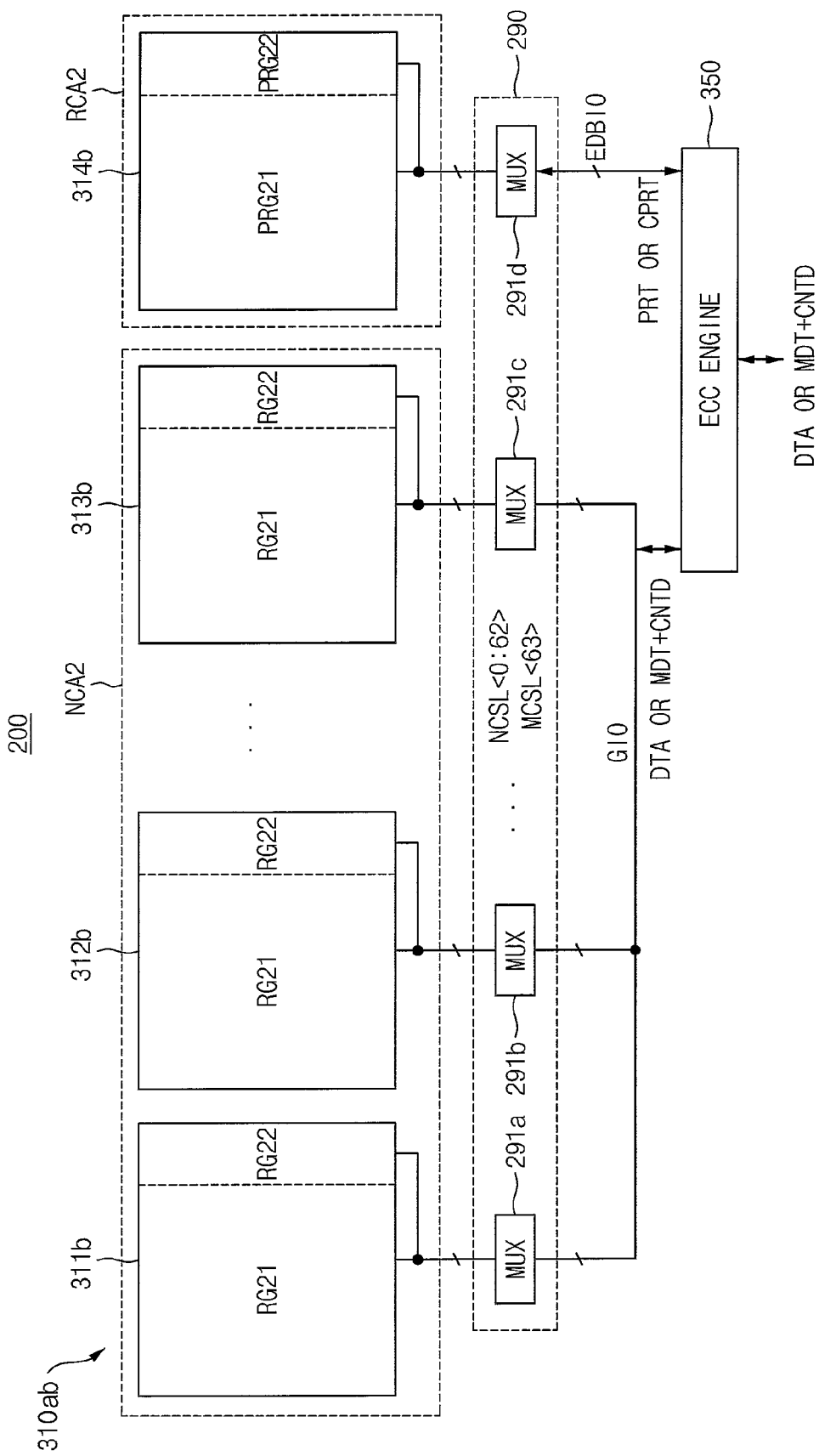
FIG. 27 illustrates a portion of the semiconductor memory device of FIG. 3 according to example embodiments.

FIG. 27 illustrates a portion of the semiconductor memory device of FIG. 3 according to example embodiments.

In FIG. 27, the control logic circuit 210, a first bank array 310ab, the I/O gating circuit 290 and the ECC engine 350 are illustrated.

Referring to FIG. 27, the first bank array 310ab includes a normal cell array NCA2 and a redundancy cell array RCA2. The normal cell array NCA2 includes a plurality of first memory blocks 311b~313b, and the redundancy cell array RCA2 includes at least a second memory block 314b. The first memory blocks 311b~313b and the second memory block 314b may each be representative of a sub array block SCB in FIG. 9.

Each of the first memory blocks 311b~313b may include a first region RG21 and a second region RG22 and the second memory block 314b may include a first region PRG21 and a second region PRG22.

Referring to FIG. 27, in a normal write operation or in a normal read operation of the semiconductor memory device 200, using a normal column selection lines NCSL<0:62>, the data DTA is written to or read from the first region RG21 in each of the first memory blocks 311b~313b and the parity data PRT is written to or read from the first region PRG21 in the second memory block 314a.

In a count data update operation of the semiconductor memory device 200, using an additional column selection line MCSL<63>, the meta data MDT and the count data CNTD is written to or read from the second region RG22 in each of the first memory blocks 311b~313b and the count parity data CPRT is written to or read from the second region PRG22 in the second memory block 314b.

In FIGS. 24 through 27, the data DTA and the count data CNTD may be input/output to/from corresponding memory regions through the same global input/output line based on time multiplexing such that an overhead of the semiconductor memory device 200 may be minimized.

Figure 28:
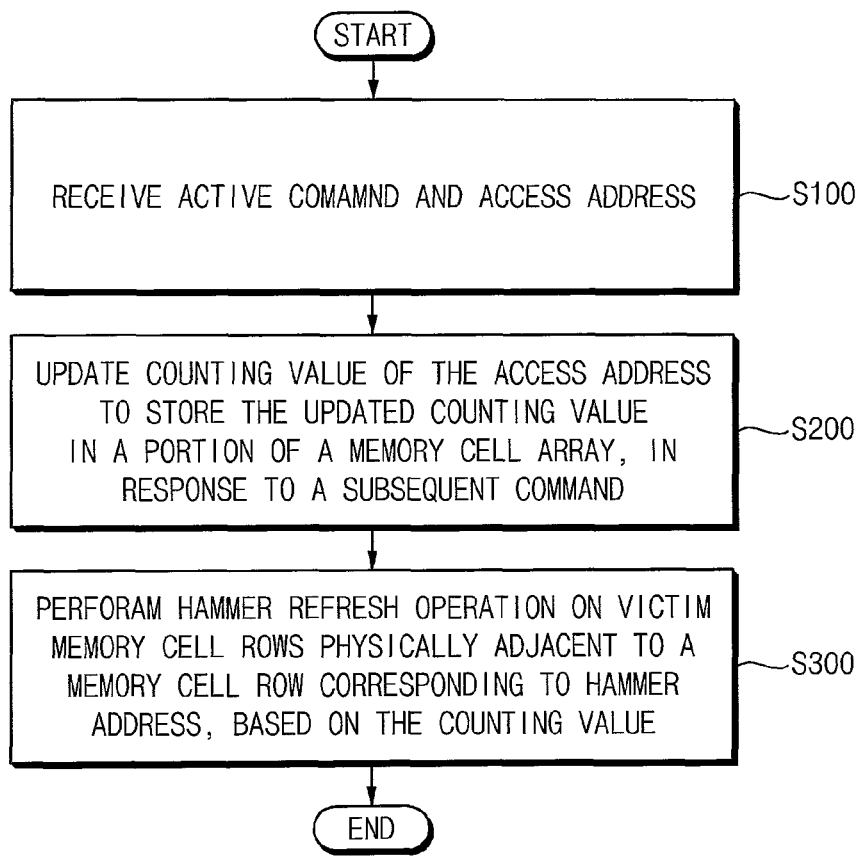
FIG. 28 is a flow chart illustrating an operation of the semiconductor memory device of FIG. 3 managing the hammer address according to example embodiments.

FIG. 28 is a flow chart illustrating an operation of the semiconductor memory device of FIG. 3 managing the hammer address according to example embodiments.

Referring to FIGS. 3, 4, 5A, 5B, and 6 to 28, the semiconductor memory device 200 receives an active command and an access address accompanied by the active command (operation S100).

The semiconductor memory device 200 updates counting values of the access address stored in a target memory cell row designated by the access address in response to a subsequent command such as an active count update command or a precharge command (operation S200). In example embodiments, the semiconductor memory device 200 updates counting values of the access address stored in a target memory cell row designated by the access address based on a read command including an auto precharge or a write command including an auto precharge which is selectively applied from the memory controller 30.

The semiconductor memory device 200 performs a hammer refresh operation on one or more victim memory cell rows physically adjacent to a memory cell row corresponding to the hammer address, based on the counting values read from the target memory cell row (operation S300).

Figure 29:
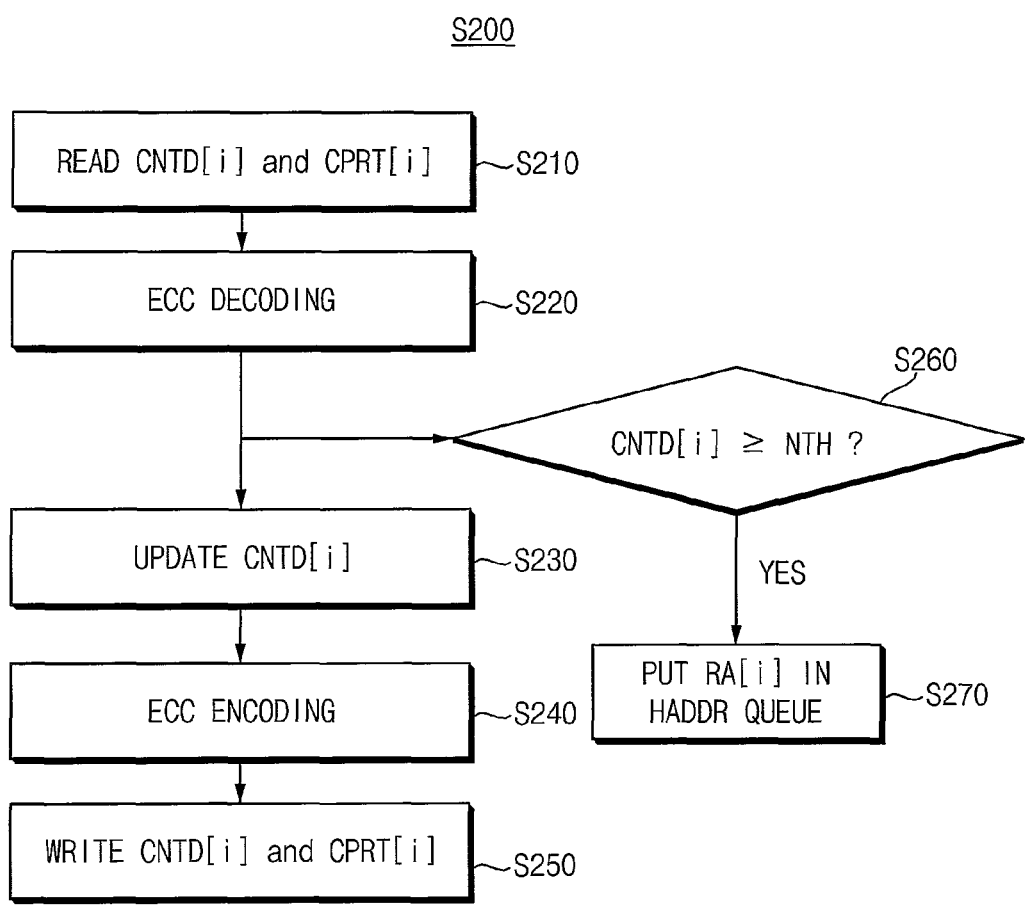
FIG. 29 is a flow chart illustrating operation of updating counting values in FIG. 28 according to example embodiments.

FIG. 29 is a flow chart illustrating operation of updating counting values in FIG. 28 according to example embodiments.

Referring to FIGS. 3, 4, 5A, 5B and 6, and 17 through 29, for updating the counting values (operation S200), the I/O gating circuit 290 reads a count data CNTD[i] and a count parity data CPRT[i] associated with the count data CNTD[i] from the target memory cell row (S210) and provides the count data CNTD[i] and the count parity data CPRT[i] to the ECC engine 350.

The ECC engine 350 performs an ECC decoding operation on the count data CNTD[i] and the count parity data CPRT[i] to correct an error bit in the count data CNTD[i] and provides the count data CNTD[i] as a corrected count data to the row hammer management circuit 500 (operation S220).

The row hammer management circuit 500 updates the count data CNTD[i] by increasing bits of the count data CNTD[i] or by adding the count data CNTD[i] and the interval count data ICNT (operation S230) and provides the updated count data CNTD[i] to the ECC engine 350.

The ECC engine 350 performs an ECC encoding operation on the updated count data CNTD[i] to generate the count parity data CPRT[i] (operation S240) and the I/O gating circuit 290 writes the updated count data CNTD[i] and the count parity data CPRT[i] in the target memory cell row (operation S250).

The row hammer management circuit 500 determines whether the count data CNTD[i] is equal to or greater than a reference number NTH (operation S260). When the count data CNTD[i] is equal to or greater than a reference number NTH (YES in operation S260), the row hammer management circuit 500 stores a row address RA[i] of the target memory cell row in the hammer address queue 530 (operation S270). The row hammer management circuit 500 may provide the refresh control circuit 400 with the row address RA[i] stored in the hammer address queue 530 as the hammer address HADDR.

Therefore, the semiconductor memory device and the memory system according to example embodiments, may store active count of each of a plurality of memory cell rows in each of the plurality of memory cell rows as the count data, and may update the count data based on a subsequent command which is applied after the active command. Therefore, the semiconductor memory device and the memory system may manage row hammer of all of the memory cell rows. In addition, because the user data and the count data are input/output through the same global input/output lines based on time multiplexing, and the ECC engine performs ECC encoding operation and ECC decoding operation on the user data and the count data based on time multiplexing, overhead may be reduced.

Figure 30:
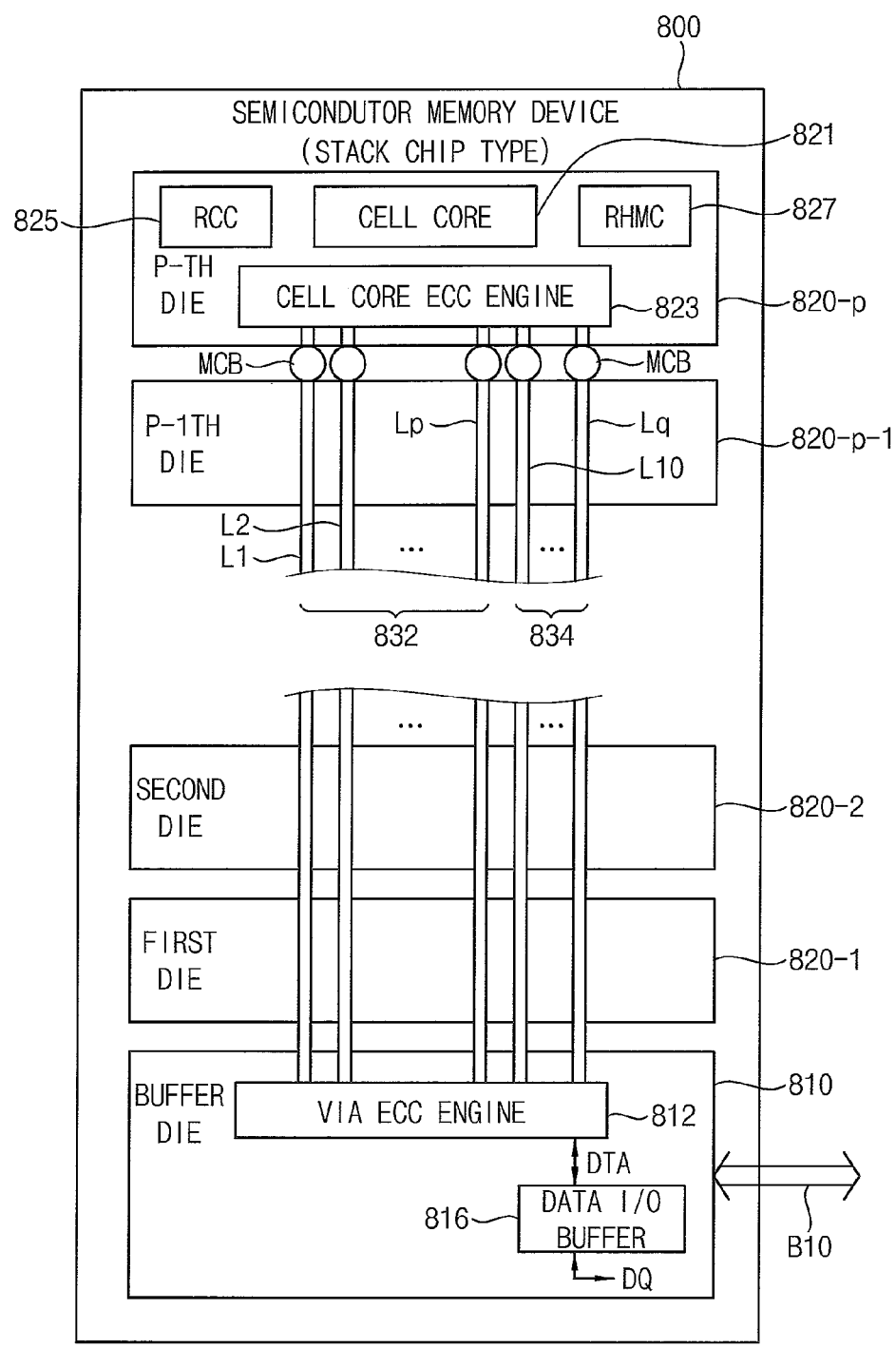
FIG. 30 is a block diagram illustrating a semiconductor memory device according to example embodiments.

FIG. 30 is a block diagram illustrating a semiconductor memory device according to example embodiments.

Referring to FIG. 30, a semiconductor memory device 800 may include at least one buffer die 810 and a plurality of memory dies 820-1 to 820-*p* (p is a natural number equal to or greater than three) providing a soft error analyzing and correcting function in a stacked chip structure.

The plurality of memory dies 820-1 to 820-*p* are stacked on the buffer die 810 and conveys data through a plurality of through silicon via (TSV) lines.

At least one of the memory dies 820-1 to 820-*p* may include a cell core 821 to store data, a cell core ECC engine 823 which generates transmission parity bits (i.e., transmission parity data) based on transmission data to be sent to the at least one buffer die 810, a refresh control circuit (RCC) 825 and a row hammer management circuit (RHMC) 827. The cell core 821 may include a plurality of memory cells having DRAM cell structure.

The refresh control circuit 825 may employ the refresh control circuit 400 of FIG. 6 and the row hammer management circuit 827 may employ the row hammer management circuit 500*a* of FIG. 5A or the row hammer management circuit 500*b* of FIG. 5B. The row hammer management circuit 827 may store active count of each of a plurality of memory cell rows in each of the plurality of memory cell rows (e.g., in the first region RG21) as a count data, may update the count data based on a subsequent command which is applied after the active command, and thus may manage row hammer of all of the memory cell rows. The refresh control circuit 825 may receive a hammer address from the row hammer management circuit 827 and may perform a hammer refresh operation on one or more victim memory cell rows physically adjacent to a memory cell row corresponding to the hammer address.

The buffer die 810 may include a via ECC engine 812 which corrects a transmission error using the transmission parity bits when a transmission error is detected from the transmission data received through the TSV liens and generates error-corrected data.

The buffer die 810 may further include a data I/O buffer 816. The data I/O buffer 816 may generate the data signal DQ by sampling the data DTA from the via ECC engine 812 and may output the data signal DQ to an outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-*p* before the transmission data is sent.

A data TSV line group 832 which is formed at one memory die 820-*p* may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-*p*.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 30, the cell core ECC engine 823 may be included in the memory die, the via ECC engine 812 may be included in the buffer die. Accordingly, it may be possible to detect and correct soft data fail. The soft data fail may include a transmission error which is generated due to noise when data is transmitted through TSV lines.

Figure 31:
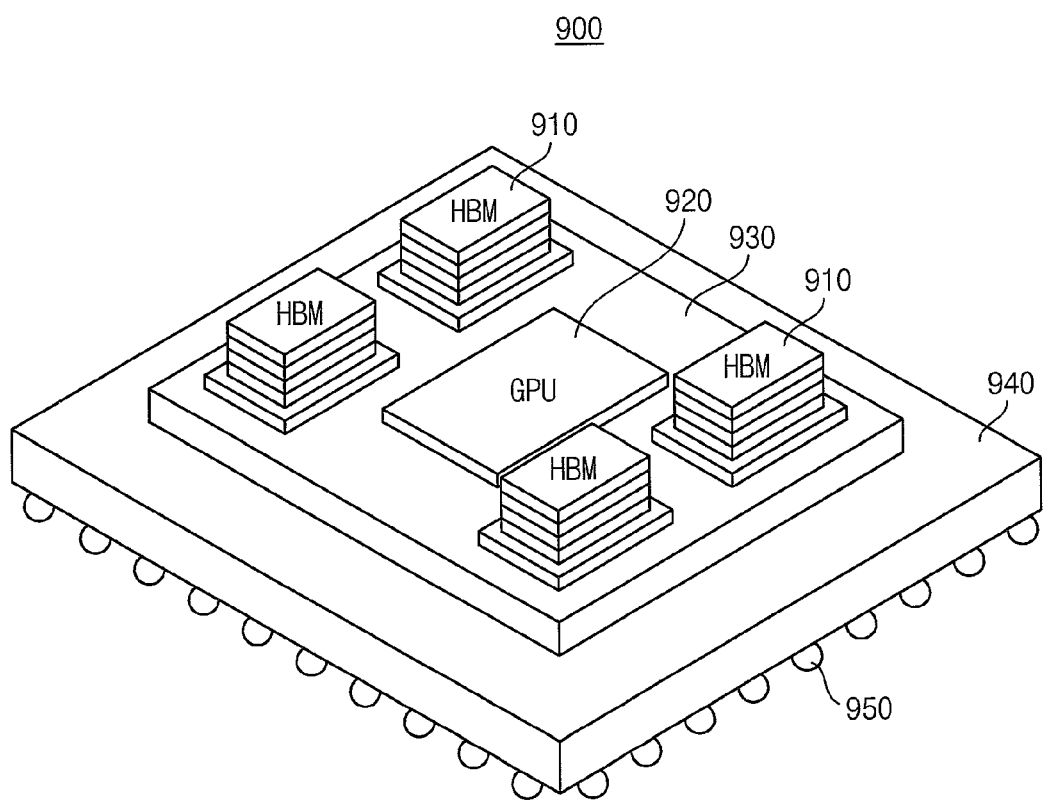
FIG. 31 is a configuration diagram illustrating a semiconductor package including the stacked memory device according to example embodiments.

FIG. 31 is a configuration diagram illustrating a semiconductor package including the stacked memory device according to example embodiments.

Referring to FIG. 31, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP). The GPU 920 may include a memory controller having a scheduler.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies include a refresh control circuit and a row hammer management circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of the present inventive concept may be applied to systems using semiconductor memory devices that employ volatile memory cells and data clock signals. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
    a memory cell array including a plurality of memory cell rows, each including a plurality of memory cells;
    a row hammer management circuit configured to:
    count a number of times of access associated with each of the plurality of memory cell rows in response to an active command from an external memory controller to store the counted values in each of the plurality of memory cell rows as count data,
    determine a hammer address associated with at least one of the plurality of memory cell rows, which is intensively accessed more than a predetermined reference number of times, based on the counted values, and in response to a first command applied after the active command, perform an internal read-update-write operation to read the count data from a target memory cell row from among the plurality of memory cell rows, to update the read count data, and to write the updated count data in the target memory cell row; and a refresh control circuit configured to receive the hammer address and to perform a hammer refresh operation on one or more victim memory cell rows which are physically adjacent to a memory cell row corresponding to the hammer address, wherein the semiconductor memory device is configured to perform a memory operation on the target memory cell row in response to a second command applied from the external memory controller after the active command, and wherein the first command is applied from the external memory controller after a predetermined delay time from the second command.

2. The semiconductor memory device of claim 1, wherein the second command corresponds to a read command designating a read operation on the target memory cell row or a write command designating a write operation on the target memory cell row, and wherein the first command corresponds to an active count update command which is applied from the external memory controller before the external memory controller applies a precharge command to the target memory cell row.

3. The semiconductor memory device of claim 1, wherein the second command corresponds to a read command designating a read operation on the target memory cell row or a write command designating a write operation on the target memory cell row, and wherein the first command corresponds to a precharge command designating a precharge operation on the target memory cell row.

4. The semiconductor memory device of claim 3, wherein the row hammer management circuit is configured to perform the internal read-update-write operation in response to:

a chip selection signal having a logic low level, and a ninth command/address signal or a tenth command/address signal from among first through fourteenth command/address signals of the precharge command, wherein each of the ninth command/address signal and tenth command/address signal has a logic low level or a logic high level, and wherein each of the ninth command/address signal and the tenth command/address signal includes at least one of a command signal and an address signal.

5. The semiconductor memory device of claim 1, wherein the row hammer management circuit is configured to perform the internal read-update-write operation in response to the first command that is selectively applied from the external memory controller after that active command.

6. The semiconductor memory device of claim 5, wherein the first command corresponds to a read command including an auto precharge or a write command including an auto precharge, wherein the row hammer management circuit is configured to perform the internal read-update-write operation in response to:

a chip selection signal having a logic high level, and a tenth command/address signal from among first through fourteenth command/address signals of the read command including an auto precharge or the write command including an auto precharge, wherein the tenth command/address signal has a logic low level or a logic high level, and wherein the tenth command/address signal includes at least one of a command signal and an address signal.

7. The semiconductor memory device of claim 1, wherein the row hammer management circuit includes:

an adder configured to update the read count data from the target memory cell row to output the updated count data;

a comparator configured to compare the read count data with the predetermined reference number of times to output a comparison signal; and a hammer address queue configured to:

store a target access address designating the target memory cell row in response to the comparison signal indicating that the read count data is equal to or greater than the predetermined reference number of times, and provide the refresh control circuit with the target access address as the hammer address.

8. The semiconductor memory device of claim 1, wherein the row hammer management circuit includes:

a counter configured to count a timing interval between the active command and a precharge command to output an interval counting value;

an adder configured to add the read count data from the target memory cell row and the interval counting value to output the updated count data;

a comparator configured to compare the read count data with the predetermined reference number of times to output a comparison signal; and a hammer address queue configured to:

store a target access address designating the target memory cell row in response to the comparison signal indicating that the read count data is equal to or greater than the predetermined reference number of times, and provide the refresh control circuit with the target access address as the hammer address.

9. The semiconductor memory device of claim 1, further comprising:

an error correction code (ECC) engine configured to:

perform an ECC decoding operation on the read count data from the target memory cell row, and perform an ECC encoding operation on the updated count data provided from the row hammer management circuit, wherein the memory cell array includes a normal cell array configured to store user data and the count data and a redundancy cell array configured to store a parity data associated with the user data and a count parity data associated with the count data, and wherein the ECC engine is configured to perform the ECC encoding operation and the ECC decoding operation on the user data and the count data which are input/output through a same global input/output line, based on time multiplexing.

10. The semiconductor memory device of claim 9, wherein:

the normal cell array includes a plurality of sub array blocks arranged in a first direction and a second direction crossing the first direction, each of the plurality of sub array blocks includes a first region and a second region, the first region of each of the plurality of sub array blocks is configured to store the user data, the second region of at least some of the plurality of sub array blocks stores the count data;

the redundancy cell array includes a first region and a second region, the first region of the redundancy cell array is configured to store the parity data, and the second region of the redundancy cell array is configured to store the count parity data.

11. The semiconductor memory device of claim 9, wherein:
the normal cell array includes a plurality of sub array blocks arranged in a first direction and a second direction crossing the first direction,
each of the plurality of sub array blocks includes a first region and a second region,
the first region of each of the plurality of sub array blocks is configured to store the user data,
the second region of each of the plurality of sub array blocks is configured to store the count data and meta data,
the redundancy cell array includes a first region and a second region,
the first region of the redundancy cell array is configured to store the parity data, and
the second region of the redundancy cell array is configured to store the count parity data.

12. The semiconductor memory device of claim 9, wherein the refresh control circuit includes:
a refresh control logic configured to generate a hammer refresh signal in response to a hammer event detection signal associated with the hammer address;
a refresh clock generator configured to generate a refresh clock signal in response to a refresh signal;
a refresh counter configured to generate a counter refresh address associated with a normal refresh operation on the plurality of memory cell rows;
a hammer address storage configured to store the hammer address and to output the hammer address in response to the hammer refresh signal; and
a mapper configured to generate hammer refresh addresses designating addresses of the one or more victim memory cell rows based on the hammer address output from the hammer address storage.

13. A memory system comprising:
a semiconductor memory device; and
a memory controller configured to control the semiconductor memory device,
wherein the semiconductor memory device includes:
a memory cell array including a plurality of memory cell rows, each including a plurality of memory cells;
a row hammer management circuit configured to:
count a number of times of access associated with each of the plurality of memory cell rows in response to an active command from the memory controller to store the counted values in each of the plurality of memory cell rows as count data;
determine a hammer address associated with least one of the plurality of memory cell rows, which is intensively accessed more than a predetermined reference number of times, based on the counted values; and
in response to a first command applied after the active command, perform an internal read-update-write operation to read the count data from a target memory cell row from among the plurality of memory cell rows, to update the read count data, and to write the updated count data in the target memory cell row; and a refresh control circuit configured to receive the hammer address and to perform a hammer refresh operation on one or more victim memory cell rows which are physically adjacent to a memory cell row corresponding to the hammer address,
wherein the memory controller is configured to apply a second command to the semiconductor memory device before the first command is applied and after the active command is applied to the semiconductor memory device such that the row hammer management circuit is configured to perform the internal read-update-write operation in response to the first command,
wherein the first command is applied from the memory controller after a predetermined delay time from the second command, and
wherein the second command is applied associated with a memory operation on the target memory cell row.

14. The memory system of claim 13, wherein the second command corresponds to a read command designating a read operation on the target memory cell row or a write command designating a write operation on the target memory cell row, and
wherein the first command corresponds to an active count update command which the memory controller applies before a precharge command for the target memory cell row, which the memory controller applies.

15. The memory system of claim 13, wherein the second command corresponds to a read command designating a read operation on the target memory cell row or a write command designating a write operation on the target memory cell row, and
wherein the first command corresponds to a precharge command designating a precharge operation on the target memory cell row.

16. The memory system of claim 13, wherein the memory controller is configured to selectively applies the first command to the semiconductor memory device after the active command such that the row hammer management circuit is configured to perform the internal read-update-write operation in response to the first command, and
wherein the first command corresponds to a read command including an auto precharge or a write command including an auto precharge.

17. A memory system comprising:
a semiconductor memory device including a memory cell array that includes a plurality of memory cell rows, each including a plurality of memory cells; and
a memory controller configured to control the semiconductor memory device,
wherein the memory controller is configured to apply an active command and a subsequent command to the semiconductor memory device such that the semiconductor memory device is configured to:
count a number of times of access associated with each of the plurality of memory cell rows in response to the active command to store the counted values in each of the plurality of memory cell rows,
manage a row hammer event of each of the plurality of memory cell rows based on the counted values, and
update the counted values of each of the plurality of memory cell rows in response to the subsequent command,
wherein the subsequent command corresponds to one of:
an active count update command which the memory controller applies after the active command and a read command designating a read operation on a target memory cell row or a write command designating a write operation on the target memory cell row, and before a precharge command, a precharge command designating a precharge operation on the target memory cell row, and including a ninth command/address signal or a tenth command/address signal each having a logic low level or a logic high level from among the first through fourteenth command/address signals of the precharge command, and a read command including an auto precharge or a write command including an auto precharge on the target memory cell row, and each including a tenth command/address signal having a logic low level or a logic high level from among the first through fourteenth command/address signals, wherein the ninth command/address signal or the tenth command/address signal of the precharge command includes at least one of a command signal and an address signal, and wherein the tenth command/address signal of the read command or the write command includes at least one of a command signal and an address signal.

\* \* \* \* \*